(12) United States Patent
Nomura et al.

(10) Patent No.: US 7,148,532 B2
(45) Date of Patent: Dec. 12, 2006

(54) FERROELECTRIC ELEMENT AND METHOD OF MANUFACTURING FERROELECTRIC ELEMENT

(75) Inventors: Kenji Nomura, Kawasaki (JP); Wensheng Wang, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 66 days.

(21) Appl. No.: 11/139,804

(22) Filed: May 31, 2005

(65) Prior Publication Data
US 2006/0175643 A1 Aug. 10, 2006

(30) Foreign Application Priority Data
Feb. 4, 2005 (JP) ............... 2005-029065

(51) Int. Cl.
*H01L 29/94* (2006.01)
(52) U.S. Cl. ............. 257/295; 257/213; 257/288; 257/E27.104; 438/3
(58) Field of Classification Search ............ None
See application file for complete search history.

(56) References Cited

U.S. PATENT DOCUMENTS
6,312,816 B1 * 11/2001 Roeder et al.

FOREIGN PATENT DOCUMENTS
| JP | 10-335596 | 12/1998 |
|---|---|---|
| JP | 2001-181094 | 7/2001 |
| JP | 2002-525876 | 8/2002 |

* cited by examiner

*Primary Examiner*—Nathan J. Flynn
*Assistant Examiner*—Kevin Quinto
(74) *Attorney, Agent, or Firm*—Westerman, Hattori, Daniels & Adrian, LLP.

(57) ABSTRACT

Additional elements of Ca, Sr, and Ir are added to a single layer lead lanthanum zirconate titanate (PLZT), thereby decreasing a c/a ratio to within a range from 1.00 to 1.008 smaller than a general c/a of a range from about 1.01 to 1.03 generally used in a lead lanthanum zirconate titanate (PLZT) crystal having a crystal structure of a tetragonal system. With this arrangement, a large switching charge Qsw can be obtained without thinning the PLZT layer even when the operation voltage is 3.0 V or less.

17 Claims, 20 Drawing Sheets

<111> Direction
(111) Surface
(001) Surface

Perobskite structure

Z=0    Z=1/2

●:+ion A    ⊙:+ion B    ○:−ion

FERROELECTRIC ELEMENT AND METHOD OF MANUFACTURING FERROELECTRIC ELEMENT

CROSS-REFERENCE TO RELATED APPLICATIONS

This application is based upon and claims the benefit of priority from the prior Japanese Patent Application No. 2005-29065, filed on Feb. 4, 2005, the entire contents of which are incorporated herein by reference.

BACKGROUND OF THE INVENTION

1) Field of the Invention

The present invention relates to a ferroelectric element having a ferroelectric layer, and a method of manufacturing a ferroelectric element.

2) Description of the Related Art

A memory is widely used in an information processing apparatus including a computer and the memory includes a volatile memory and a nonvolatile memory. The volatile memory includes a semiconductor memory such as a DRAM and an SRAM. When a power supply is turned off, information stored in the volatile memory is lost. The nonvolatile memory includes a magnetic disk unit, an EEPROM, a flash memory, and the like. The nonvolatile memory has an advantage in that information stored in this memory is not lost even when a power supply is turned off. Recently, a ferroelectric element (FRAM: "FRAM" is a registered trademark) that stores information in a form of a spontaneous polarization of a ferroelectric layer is developed as this kind of nonvolatile memory. The ferroelectric element has a capacitor of a memory cell area structured by a ferroelectric. The ferroelectric element writes information using a polarization of the ferroelectric by applying an electric field, thereby increasing a writing speed and decreasing power consumption, as compared with an EEPROM and a flash memory that writes information by injecting electron. This ferroelectric element also has an advantage in that the life of the ferroelectric element can be increased by using the polarization of the ferroelectric.

However, the ferroelectric element is required to have an increased memory capacity and is required to operate stably even when the operation voltage is decreased from 5 V to 3 V to suppress power consumption.

The ferroelectric element involves a phenomenon that the polarization decreases while an inverted operation of the ferroelectric is repeated. This phenomenon is called fatigue characteristics, which impart a large influence on the life of the ferroelectric element. Therefore, the ferroelectric element is also required to have excellent fatigue characteristics.

As means for increasing the memory capacity, the size of the capacitor of the ferroelectric element can be made smaller. To decrease the capacitor means to decrease the amount of the ferroelectric. In other words, the switching charge per one capacitor becomes smaller. The ferroelectric element records information by changing over the switching charge of the ferroelectric. When the switching charge becomes smaller, the recorded information becomes unstable.

Further, as means for decreasing the operation voltage, the ferroelectric layer of the ferroelectric element is made thinner, and a large electric field is applied to this layer, thereby maintaining a large switching charge. However, when the thickness of the ferroelectric layer is decreased to 100 nm or below, a leak current increases rapidly. Therefore, there is a limit to the thinning of the ferroelectric layer. When the operation voltage is decreased, the fatigue characteristics can be decreased.

In order to solve these problems, Japanese Patent Application Laid-Open No. H10-335596 discloses a ferroelectric element having many ferroelectric layers sandwiched by conductive electrodes. In this ferroelectric element, a layer that is in contact with the conductive electrodes is a cubic system or a tetragonal system in which a ratio of a length of an axis c to a length of an axis a (c/a) of a crystal structure is equal to or larger than 1.00 and smaller than 1.02. A layer that is not in contact with the conductive electrodes is a ferroelectric layer of a tetragonal system. Japanese Patent Application Laid-Open No. 2001-181094 discloses a ferroelectric multilayer structure that includes at least a ferroelectric layer of a perobskite structure having [111] oriented grains and a film that gives a two-dimensional tensile stress within a surface perpendicular to the [111] direction of the ferroelectric layer, as a layer structure. Japanese Patent Application Laid-Open No. 2002-525876 discloses a ferroelectric memory cell including: a first metal oxide electrode; a ferroelectric layer that is formed on the first electrode, has a perobskite crystal structure, and includes Pb, Zr, Ti, O, and at least one additional rare-earth element; a second electrode that is formed on the ferroelectric layer; and a circuit that is connected to the two electrodes to feed power, control, and read a charge accumulated on the ferroelectric layer, and that has a maximum DC power supply voltage of 3 V or less, wherein the ferroelectric layer includes at least one of the rare-earth elements having a sufficient percentage, and the circuit can be operated at the maximum DC power supply voltage.

However, according to Japanese Patent Application Laid-Open No. H10-335596 and Japanese Patent Application Laid-Open No. 2002-525876, residual polarization is not large, and a switching charge Qsw is not large. According to Japanese Patent Application Laid-Open No. 2001-181094, the ferroelectric layer sandwiched by the electrodes has many layers, and a manufacturing process becomes complex. Therefore, none one of these disclosed techniques provide a satisfactory ferroelectric element that has a low operation voltage and a low power consumption that is excellent in fatigue characteristics, and that has a large switching charge Qsw.

SUMMARY OF THE INVENTION

The present invention has been achieved in order to solve the above problems. It is an object of the present invention to provide a ferroelectric element having a ferroelectric layer that has a low operation voltage and a low power consumption, that is excellent in fatigue characteristics, and that can be operated at a large switching charge Qsw. It is another object of the present invention to provide a method of stably manufacturing a ferroelectric element that simplifies a heat treatment process, that has a low operation voltage and a low power consumption, that is excellent in fatigue characteristics, and that has a large switching charge Qsw.

In order to solve the above problems, the present invention provides a ferroelectric element in which additional elements such as Ca, Sr, and Ir are added to a single layer of lead lanthanum zirconate titanate (hereinafter simply referred to as "PLZT") as a ferroelectric layer, in a crystal structure of a tetragonal system in which a (c/a) ratio of a length of an axis c to a length of an axis a is within a range from 1.001 to 1.008. With this arrangement, a large switching charge Qsw can be obtained without thinning the layer even when the operation voltage is equal to or lower than 3.0 V.

Further, the present invention provides a method of manufacturing a ferroelectric element, including: a step of forming a single layer lead lanthanum zirconate titanate (PLZT) precursor containing additional elements that make the (c/a) axis ratio to within a range from 1.001 to 1.008 on a lower electrode of a conductive electrode; a step of first heat treating the precursor; and a step of heat treating the precursor after forming an upper electrode.

Further, the present invention provides a method of manufacturing a ferroelectric element, including: a step of forming a single layer lead lanthanum zirconate titanate (PLZT) precursor containing additional elements that make the (c/a) axis ratio to within a range from 1.001 to 1.008 on a lower electrode of a conductive electrode; and a step of heat treating the precursor after forming an upper electrode.

DETAILED DESCRIPTIONS

Exemplary embodiments of the present invention will be explained below with reference to the drawings. Since various modifications and changes within the scope of the invention will readily occur to those skilled in the art, such modifications and changes will fall within the scope of the invention.

A ferroelectric element according to the present invention has a crystal structure of a tetragonal system, and conductive electrodes sandwich a single layer ferroelectric layer consisting of a PLZT containing additional elements that make the (c/a) axis ratio to within a range from 1.001 to 1.008.

Figure 1:
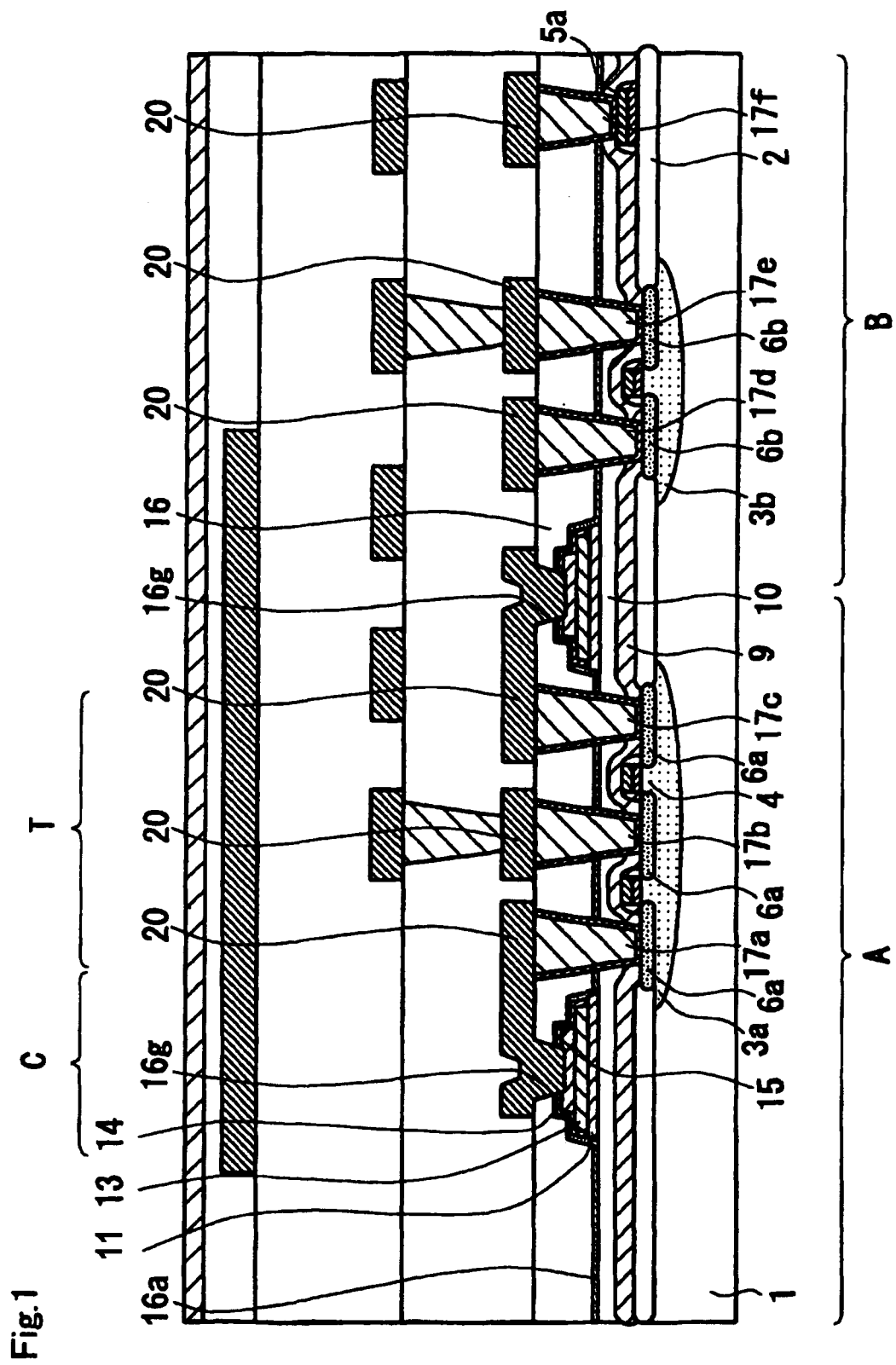
FIG. 1 is a cross-sectional view showing a schematic configuration of a ferroelectric element according to the present invention.

FIG. 1 is a cross-sectional view showing a schematic configuration of the ferroelectric element according to the present invention.

The ferroelectric element includes a memory cell area A and a peripheral circuit area B. The memory cell area A includes a capacitor area C and a transistor area T. The capacitor C includes a lower electrode 12, a ferroelectric layer 13, and an upper electrode 14 on an $Al_2O_3$ ground layer 11. An encap layer 15 and other layers are provided on the upper electrode 14.

For the ferroelectric layer 13, a ferroelectric having a lead lanthanum zirconate titanate (PLZT) tetragonal system perobskite structure is used. This is because the control of the axis ratio of the PLZT is easier than that of other lead zirconate titanate (PZT).

The PLZT has a tetragonal system crystal structure. Lattice constants a, b, and c of a, b, and c axes of the tetragonal system are in a relationship of $a=b\pm c$. The (c/a) axis ratio of the lattice constant c to the lattice constant a is set to within a range from 1.001 to 1.008. Conventionally, in manufacturing a ferroelectric element including a PLZT thin film having a tetragonal structure of a large switching charge Qsw, the (c/a) axis ratio is generally increased. However, Qsw and the residual polarization Pr have a relationship that Qsw is nearly equal to 2Pr. The spontaneous polarization Ps and the (c/a) axis ratio have a relationship of $Ps^2=A((c/a)-1)$ (where A is a constant). The residual polarization Pr and the spontaneous polarization Ps are substantially equal to each other, and the residual polarization Pr is said to be slightly smaller than the spontaneous polarization Ps. Therefore, it is conventionally presumed that when the (c/a) axis ratio is set larger, Qsw becomes larger. However, according to the ferroelectric element of the present invention, this axis ratio is set to within a range from 1.001 to 1.008 that is smaller than the conventional range from 1.01 to 1.03. With this arrangement, a large switching charge (hereinafter referred to as "Qsw") can be obtained without thinning the ferroelectric layer 13 even when the operation voltage is 3.0 V or less.

Figure 2:
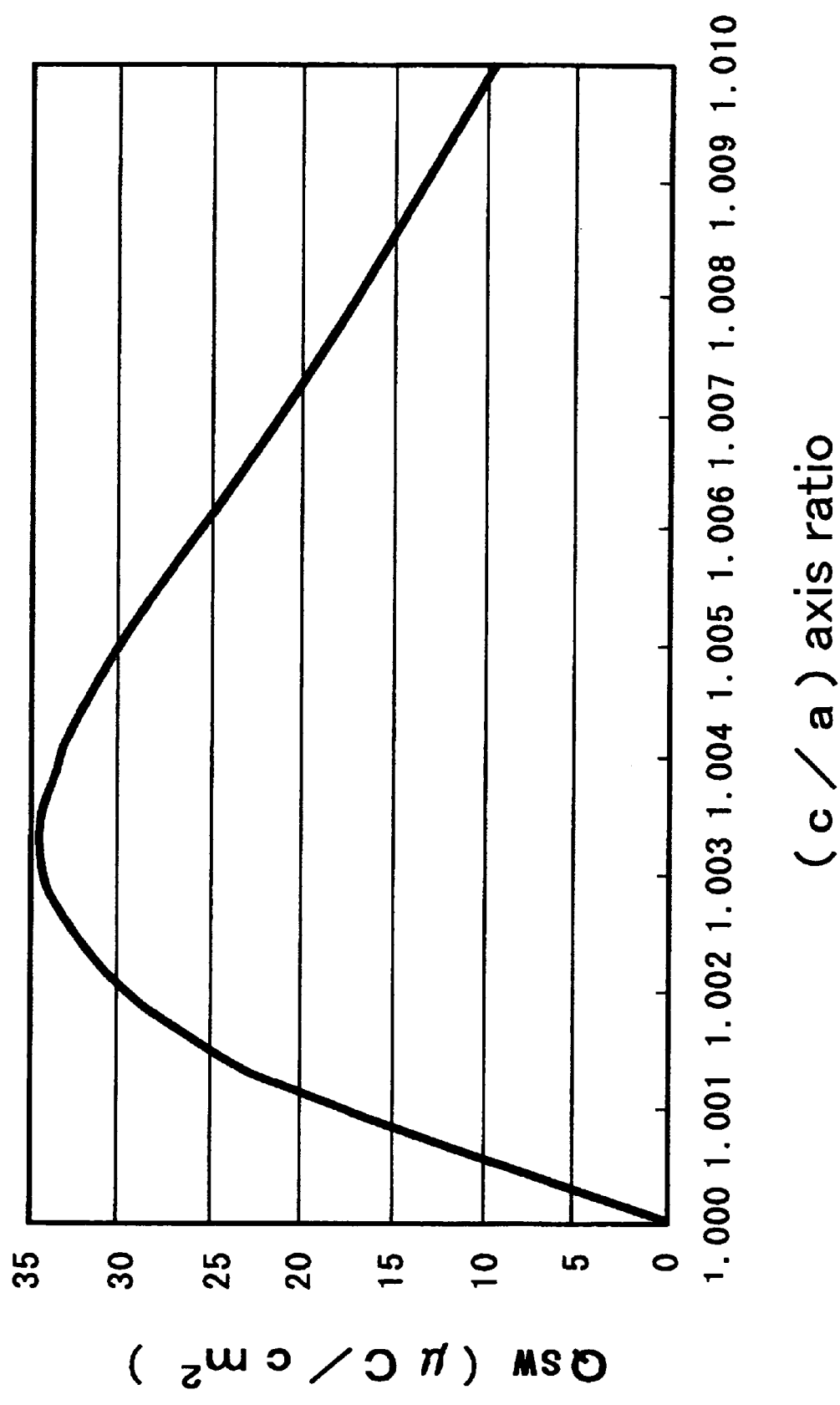
FIG. 2 is a graph showing a relationship between a (c/a) axis ratio and Qsw of a PLZT layer having a layer thickness of 120 nm when operated at 3 V.

FIG. 2 is a graph showing a relationship between the (c/a) axis ratio and Qsw of a PLZT layer having a layer thickness of 120 nm when the ferroelectric element according to the present invention is operated at 3 V. It is better to have higher Qsw but there is no practical problem as long as Qsw is at least equal to or higher than 17 ($\mu C/cm^2$). As is clear from FIG. 1, Qsw does not become smaller even when the (c/a) axis ratio is set to 1.010 or smaller. When the (c/a) axis ratio is set to within the range from 1.001 to 1.008, Qsw equal to or above 17 ($\mu C/cm^2$) can be obtained. With this arrangement, the ferroelectric element can be operated stably at a small power supply voltage of 3 V. Further, by obtaining the large Qsw, the capacitor can be made smaller.

The ferroelectric layer 13 is used as a single layer sandwiched by conductive electrodes.

Conventionally, in order to increase Qsw, it is considered appropriate to increase the (c/a) axis ratio. In order to improve fatigue characteristics, it is considered appropriate to decrease the (c/a) axis ratio. Therefore, a ferroelectric element having a multilayer structure, with the PLZT having a (c/a) axis ratio from about 1.01 to 1.03 and only the surface layer having a small (c/a) axis ratio, is conventionally considered.

However, according to the ferroelectric element of the present invention, since Qsw can be increased by decreasing the (c/a) axis ratio, the ferroelectric element can be manufactured in a single layer. Further, since Qsw is large, the ferroelectric element can be operated at a low voltage, and the fatigue characteristics can be improved.

Further, according to the ferroelectric element of the present invention, the ferroelectric layer 13 is set to 100 nm or above. Based on this thickness, the occurrence of a leak current can be suppressed, and the operation of the ferroelectric element can be stabilized.

When the (c/a) axis ratio is set to within a range from 1.001 to 1.008 and when the ferroelectric layer 13 has a thickness of 120 nm, and also when the positive and negative polarities are switched over to each other by turning on and off by $1\times10^{12}$ times, the reduction of the residual polarization is actually within 1%, and there is no practical problem in the fatigue characteristics. There is no leak current either.

Figure 3:
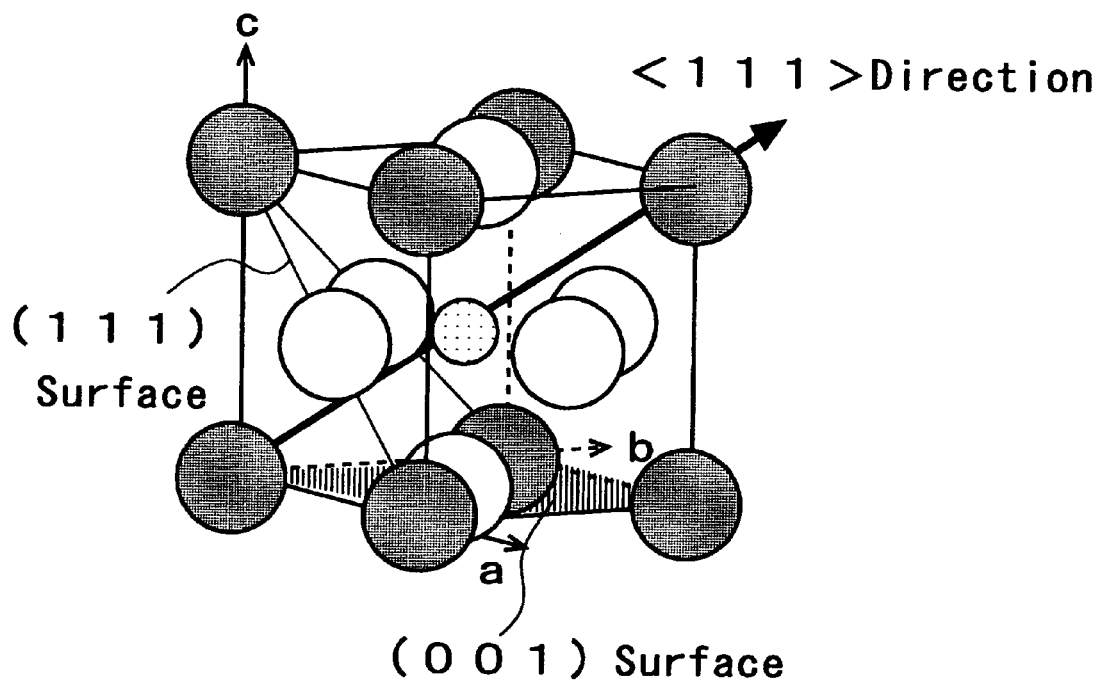
FIG. 3 is a diagram showing a crystal structure of PLZT.
Figure 3:
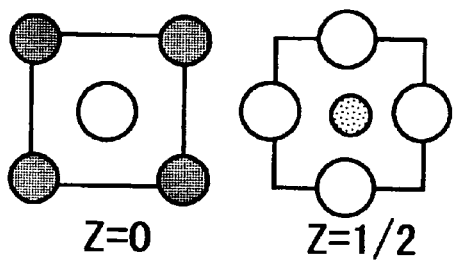

The PLZT that constitutes the ferroelectric layer 13 has the (111) surface orientation in the thickness direction to 90% or above. FIG. 3 is a diagram showing a crystal structure of the PLZT. The PLZT of the tetragonal system has an easily polarizable axis direction in the <001> direction of the axis c. Therefore, when the whole ferroelectric layer 13 in the thickness direction is oriented to the (001) surface, Qsw can be made largest. Further, Qsw is zero in the <100> direction of the axes a and b of the other edge line. When the PLZT is crystallized without any constraint such as the epitaxial effect, the <001> direction and the <100> direction appear at the ratio of 1:2. This is because the [001] direction is a dominant direction of crystallization, and three directions grow equally. In this case, Qsw of the ferroelectric layer 13 becomes an average of the total, and Qsw decreases to one third of Qsw obtained when polarization appears all in the <001> direction. When the capacitor area becomes fine and becomes substantially equal to the domain size as the ferroelectric element, Qsw of the capacitor when the <001> direction appears becomes large, and Qsw of the capacitor when the <100> direction appears becomes zero. Consequently, a capacitor that does not operate is generated during manufacturing of the ferroelectric elements, resulting in a reduction in the manufacturing yield. Further, when a stress such as a tensile stress is applied when a Curie point of the PLZT is exceeded during the manufacturing process, the crystal orientation that is directed to the <001> direction changes to the <100> direction, thereby substantially decreasing Qsw.

Accordingly, large Qsw can be stably obtained by orienting the crystallization of the PLZT layer 13 of the ferroelectric element to the <111> direction that is between the three directions of the <001> direction, the <010> direction, and the <001> direction, instead of aligning the crystallization in the <001> direction. The thickness direction of the PLZT layer 13 is set to the <111> direction, and is oriented to the (111) surface.

The orientation to the (111) surface can be achieved by epitaxially growing the PLZT layer via the lower electrode 12 or the like formed on a Si substrate that is cut such that the (111) surface becomes the front surface. More preferably, when metals and the like such as Pt and Ir that are oriented to the (111) surface with priority are set as the lower electrode, the degree of orientation of the PLZT layer 13 to the (111) surface can be increased.

This orientation degree can be obtained as follows. In the X-ray measurement, X-ray is incident to the surface of the ferroelectric layer 13 at an angle θ, and all reflection peak intensities measured by the 2θ/θ method are obtained. The orientation degree can be obtained from a proportion of orientation to the (111) surface based on all the reflection peak intensities and a specific angle.

The PLZT that is used for the ferroelectric element according to the present invention is expressed as $((Pb_y, La_{1-y})(Zr, Ti)O_3$, where $0 \leq y \leq 1)$. As shown in FIG. 2, the PLZT is a tetragonal system, and has a perobskite structure having a combination of one lattice (hereinafter, "A lattice") containing lead (Pb) and another lattice (hereinafter, "B lattice") containing zirconium (Zr) and titanium (Ti). The PLZT has a molar ratio (Zr/Ti) of Zr to Ti that form this B lattice, of 1.0 or below. It is preferable that at least the molar ratio (Zr/Ti) is 0.4 or above. Based on the molar ratio (Zr/Ti), it is possible to control structure characteristics such as a crystallization temperature, Curie temperature, a size of a crystal grain, and a shape of a crystal grain, and other characteristics such as saturation or residual polarization, anti-electric field, fatigue characteristics, and a leak current. When the molar ratio (Zr/Ti) exceeds 1.0, rhombohedron is precipitated in some cases. Particularly, when the molar ratio (Zr/Ti) is 1.0, Qsw can be increased, and the PLZT layer 13 having small leak current can be obtained.

When the molar ratio (Zr/Ti) is within a range from 0.4 to 1.0, the (c/a) axis ratio is 1.02 or above. When at least one element selected from metal elements of alkali earth metal or iron family is added as an additional element, the (c/a) axis ratio can be set to within a range from 1.001 to 1.008. Among the alkali earth metal, Ca and Sr are particularly preferable. Among the iron family, Ir and Ru are particularly preferable. These can be added in combination. These additional elements are preferably within a range from 0.01 to 0.1 per 1.0 of the PLZT. When the additional elements are less than 0.01 per 1.0 of the PLZT, the (c/a) axis ratio cannot be made smaller. When the additional elements exceeds 0.1 per 1.0 of the PLZT, the crystal grain becomes small, the degree of orientation of the (111) surface becomes small, and Qsw also becomes small.

According to the ferroelectric element of the present invention, among the electrodes that sandwich the ferroelectric layer 13, the lower electrode 12 includes any one of Pt, Ir, and $IrO_x$. In this case, x represents 2 of a stoichiometric composition, but this is not necessarily a stoichiometric composition. Pt is a rare metal having high conductivity, and is not easily oxidized. Therefore, Pt does not form an oxide in the heat treatment or the like during manufacturing, and can obtain stable conductivity. Ir has conductivity even when an oxide $IrO_x$ is formed by oxidation, and can obtain stable conductivity. Therefore, Pt and Ir can be mixed as a mixed crystal. Pt and Ir have high adhesiveness with the lower substrate and the upper PLZT layer 13, and are little peeled off by repeated use.

According to the ferroelectric element of the present invention, the upper electrode 14 includes any one of Ir, $IrO_x$, Ru, $RuO_x$, and $SrRuO_3$. These metals and their oxides have high adhesiveness with the lower ferroelectric layer 13, and are little peeled off by repeated use. Even when an oxide is formed, high conductivity can be obtained. Therefore, these metals Ir and Ru, or their oxides $IrO_x$, Ru, and $RuO_x$ are used, and are used as additional elements to the PLZT according to the present invention. Even when there is diffusion by the heat treatment during manufacturing, Sr has a little adverse effect on the polarization characteristics and fatigue characteristics of the PLZT. $SrRuO_3$ is a highly conductive oxide. Sr has a little adverse effect on the polarization characteristics and fatigue characteristics of the PLZT layer 13.

The ferroelectric element according to the present invention can obtain large Qsw by decreasing the (c/a) axis ratio. Consequently, in a single layer, the ferroelectric element can be operated stably at a low operation voltage, without decreasing the layer thickness. Further, a reduction in Qsw due to fatigue can be suppressed.

While the ferroelectric element according to the present invention is explained as the ferroelectric capacitor that constitutes the memory cell of the ferroelectric memory unit, the ferroelectric element is not limited to the ferroelectric memory unit. The ferroelectric element can be also used as a thin-film capacitor, a piezoelectric element, or an optical element within a general semiconductor integrated circuit.

A method of manufacturing the ferroelectric element according to the present invention is explained below.

Figure 4:
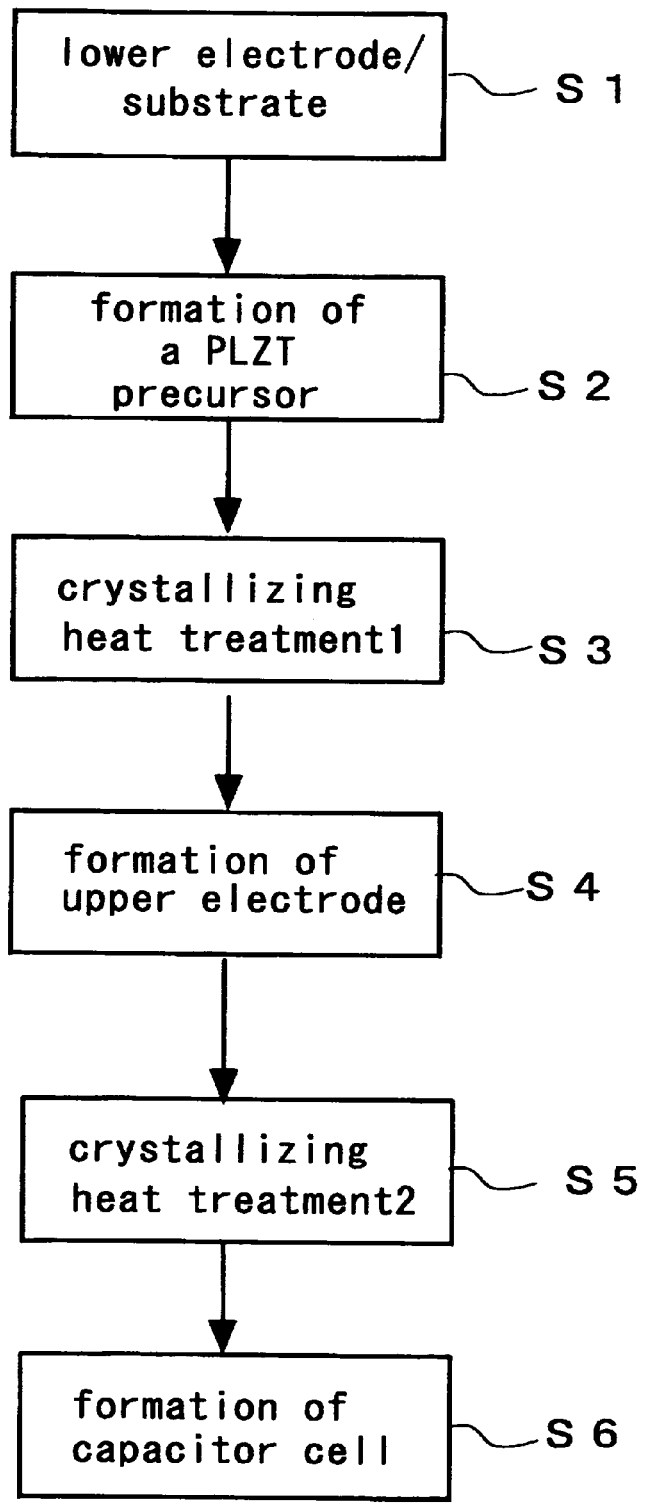
FIG. 4 is a flowchart showing a method of manufacturing the ferroelectric element according to the present invention.

FIG. 4 is a flowchart showing a method of manufacturing the ferroelectric element according to the present invention.

The method of manufacturing the ferroelectric element having the single layer ferroelectric layer 13 sandwiched by conductive electrodes on a substrate according to the present invention, includes: a step of forming a single layer PLZT precursor containing additional elements that make the (c/a) axis ratio to within a range from 1.001 to 1.008 on the lower electrode 12 of a conductive electrode; a step of first heat treating the precursor; and a step of second heat treating the precursor after forming the upper electrode 14 containing both or either one of $IrO_x$ and Ir thereon.

The ferroelectric layer 13 of PLZT can be formed according to any one of a solution technique such as a sol-gel method, a sputtering method, and a CVD method. In the present example, a sputtering method is used to form a precursor of a ferroelectric in an amorphous phase on the lower electrode 12 of the substrate. Thereafter, a ferroelectric film is heat treated to be crystallized in a perobskite structure. Since the ferroelectric layer 13 is crystallized in an oxidizing atmosphere, a rare metal such as Pt or an oxide having conductivity even in the oxidized state is used for the electrode of the capacitor. In further details, the lower electrode 12 is formed according to the PVD method such as the conventional sputtering method, or the CVD method (step S1). For example, based on the sputtering method, the lower electrode 12 is heated at 350° C., with DC power 1 kW, in the Ar gas atmosphere of pressure 0.6 Pa, thereby forming the film thickness in a range from 100 to 200 nm.

Next, a PLZT precursor in an amorphous phase is formed on the lower electrode 12 (step S2). The PLZT precursor is deposited in the thickness of a range from 100 to 200 nm, with RF power 1 kW, in the Ar gas atmosphere of pressure 0.7 Pa, according to the RF sputtering method of 1.1 Pa, for example. Next, a first heat treatment of crystallizing the PLZT is carried out (step S3). It is desirable that the heat treatment is carried out in the oxidizing atmosphere having a small amount of oxygen ($O_2$), NO, and $N_2O$ gas added to inert gas such as Ar, He, and $N_2$. The oxygen ($O_2$) concentration is set such that the ratio of oxygen to the inert gas is within a range from 1 to 50:50 to 99%. With the above arrangement, loss of oxygen can be prevented, and orientation can be increased. The heat treatment temperature is preferably within a range from 550 to 650° C., more preferably less than 600° C., to control the crystal particle size and to suppress the precipitation of rhombohedral. For example, the heat treatment is carried out at 585° C. for 90 seconds in the oxidizing atmosphere of $O_2/Ar=2.5/97.5\%$. The crystallization is carried out such that a tetragonal system in the perobskite structure is formed from the amorphous state, and the PLZT layer 13 is oriented to the (111) surface. However, even when the orientation of the PLZT to the (111) surface is not equal to or more than 90%, the orientation degree can be further increased in the subsequent heat treatment. Further, by setting the PLZT layer 13 in a tetragonal system, diffusion of components of the PLZT layer 13 and the upper electrode 14 due to the heat at the subsequent formation of the upper electrode 14 can be prevented.

Next, the upper electrode 14 containing Ir and $IrO_x$ is formed on the PLZT layer 13 (step S4). The upper electrode 14 is formed by the sputtering method, at a room temperature by setting DC plasma power to 1.0 kW, while passing $O_2$ gas by 100 sccm, in the Ar gas atmosphere of pressure 0.8 Pa, for example.

Thereafter, adhesiveness between the PLZT layer 13, the lower electrode 12, and the upper electrode 14 is increased, and a second heat treatment is carried out to crystallize the PLZT layer 13 in the tetragonal system (step S5). The heat treatment is carried out in the oxidizing atmosphere such that the ratio of oxygen ($O_2$) to the inert gas is within a range from 1 to 50:50 to 99%. Based on this, high polarization characteristics can be obtained. The heat treatment is carried out at a temperature within a range from 700 to 800° C., higher than the heat treatment temperature at step 3. Since the PLZT is crystallized in the tetragonal system, by heat treating the PLZT at a high temperature for a short time, diffusion and evaporation of Pb or the like can be prevented. For example, the PLZT is heat treated at 725° C. for 20 seconds in the oxidizing atmosphere of $O_2/Ar=1/99\%$. The PLZT precursor is heat treated to be crystallized to form the PLZT layer 13. The lower electrode 12 and the upper electrode 14 are closely adhered to the PLZT layer 13. At the same time, the lower electrode 12, the PLZT layer 13, and the upper electrode 14 are heat treated to be elaborated, thereby increasing productivity.

Preferably, heat treatment is carried out by irradiating an infrared ray with a lamp or a heater, without bringing the PLZT into contact with the heater or the like. Crystallization is carried out preferably according to the RTA (rapid thermal anneal) method. The RTA method is suitable for smoothing the interface, because diffusion and reaction of the lower electrode 12 or the upper electrode 14 and the PLZT layer 13 can be suppressed by this method.

As a result, the capacitor portion of the ferroelectric element according to the present invention is formed (step S6).

Figure 5:
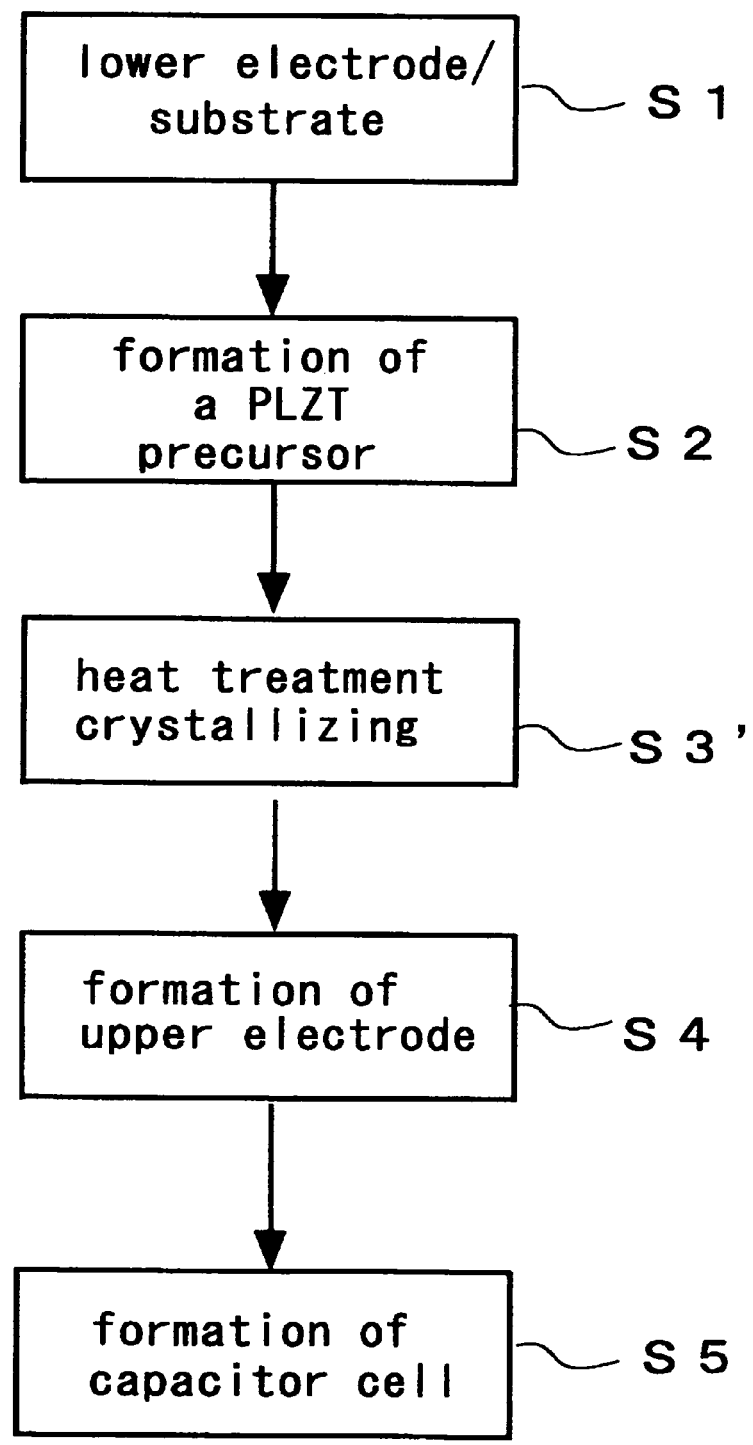
FIG. 5 is a flowchart showing another method of manufacturing the ferroelectric element according to the present invention.

FIG. 5 is a diagram showing a process of another method of manufacturing the ferroelectric element according to the present invention.

The method of manufacturing the ferroelectric element according to the present invention includes: a step of forming a single layer PLZT precursor containing additional elements that make the (c/a) axis ratio to within a range from 1.001 to 1.008 on the lower electrode 12 of a conductive electrode; and a step of forming the upper electrode 14 containing both or either one of $IrO_x$ and Ir on the precursor, and thereafter heat treating the precursor.

According to the manufacturing method, the lower electrode 12 is formed according to the conventional sputtering method (step S1), in a similar manner as explained above. For example, based on the sputtering method, the lower electrode 12 is heated at 350° C., with DC power 1 kW, in the Ar gas atmosphere of pressure 0.6 Pa, thereby forming the film thickness in a range from 100 to 200 nm. A PLZT precursor in an amorphous state is formed on this lower electrode 12 (step S2). The PLZT precursor is deposited in the thickness of a range from 100 to 200 nm, with RF power 1 kW, in the Ar gas atmosphere of pressure 0.7 Pa, according to the RF sputtering method of 1.1 Pa, for example.

Next, a heat treatment is carried out to form the ferroelectric layer 13 of PLZT by crystallizing the PLZT precursor in the tetragonal system from an amorphous phase (step S3'). This heat treatment is carried out at 585° C. for 90 seconds in the oxidizing atmosphere of $O_2/Ar=2.5/97.5\%$. In this case, the PLZT layer 13 can be crystallized and oriented to the (111) surface at the same time. The $O_2$ concentration has a large influence on this orientation, and it is preferable that the ratio of oxygen ($O_2$) to the inert gas is within a range from 1 to 50:50 to 99%.

The heat treatment can be carried out at two stages. First, the PLZT is heat treated at about 600° C. or below at which rhombohedral is not precipitated, and next, the PLZT is heat treated at a higher temperature for a short time. For example, the first heat treatment is carried out at 600° C. for 90 seconds in the oxidizing atmosphere of $O_2/Ar=2.5/97.5\%$. The second heat treatment is carried out at 750° C. for 60 seconds in the oxidizing atmosphere of $O_2$ 100%. With this arrangement, productivity can be improved without mixed crystallizing the rhombohedral.

Next, after the PLZT layer 13 is formed and crystallized, the upper electrode 14 including $IrO_x$ and Ir is formed (step S4'). The upper electrode 14 is formed by, for example, the sputtering method, at 250° C. by setting DC plasma power to 1.0 kW, while passing $O_2$ gas by 100 sccm, in the Ar gas atmosphere of pressure 0.8 Pa, thereby depositing in a thickness of 50 to 200 nm. By forming the upper electrode 14 at a low temperature, diffusion of Ir and O from the upper electrode 14 to the PLZT layer 13 can be suppressed. As a result, the composition of the PLZT layer 13 can be maintained, and a variation of the (c/a) axis ratio of the tetragonal system can be minimized.

In this case, the additional element is at least one element selected from metal elements of alkali earth metal or iron family. Particularly, the additional element is one or more elements selected from a group of Ca, Sr, Ir, and Ru. The lower electrode 12 includes any one of Pt, Ir, and $IrO_x$, and the upper electrode 14 includes any one of Ir, $IrO_x$, Ru, $RuO_x$, and $SrRuO_3$, most preferably $IrO_x$, and Ir.

EMBODIMENT

An embodiment of the present invention is explained in detail below with reference to drawings.

FIG. 6 to FIG. 20 are cross-sectional views for explaining each process in a method of manufacturing the ferroelectric elements according to the present invention.

Figure 6:
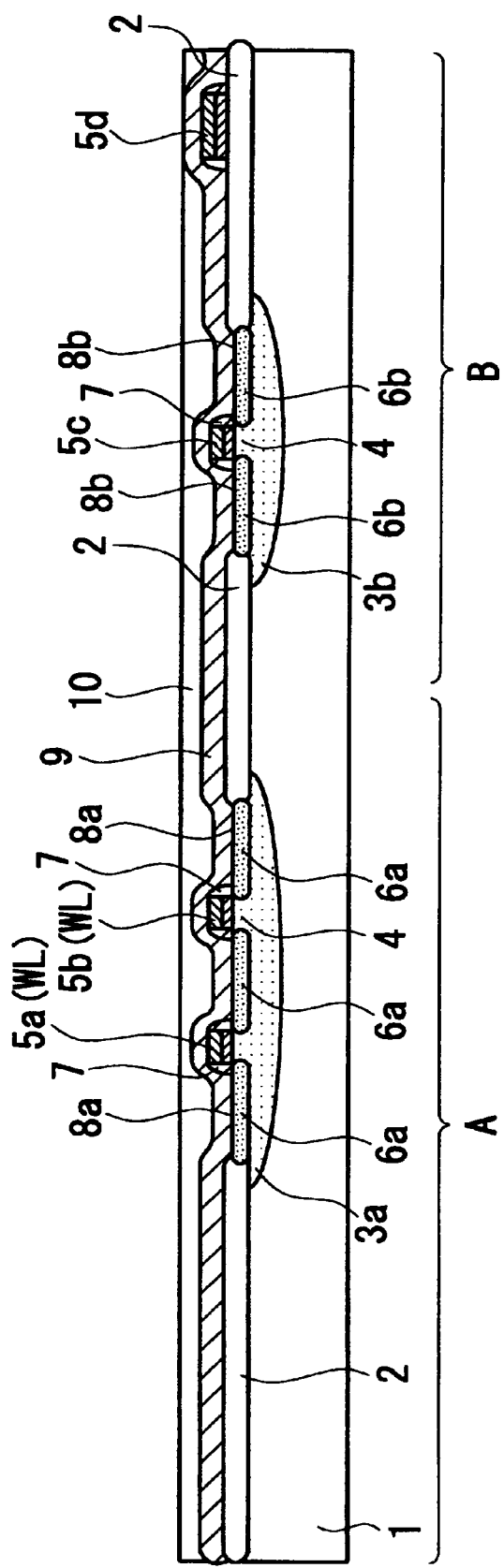
FIG. 6 is a diagram for explaining a process up to formation of an interlayer insulation layer from a silicon substrate.

FIG. 6 is a diagram for explaining a process up to formation of an interlayer insulation layer from a silicon substrate.

As shown in FIG. 6, an element separation insulator 2 is formed on the surface of an n-type or a p-type silicon (semiconductor) substrate 1 according to a LOCOS (local oxidation of silicon) method. The element separation insulator 2 can be formed according to an STI (shallow trench isolation) method in addition to the LOCOS method.

After the element separation insulator 2 is formed, a p-type impurity and an n-type impurity are selectively introduced into a predetermined active area (transistor formation area) in a memory cell area A and a peripheral circuit area B on the silicon substrate 1, and a p-well (not shown) to form a p-well 3a and an n-well 3b is formed.

Thereafter, the active area surface on the silicon substrate 1 is thermally oxidized to form a silicon oxide layer as a gate insulation layer 4. Next, an amorphous or polycrystalline silicon layer is formed on the whole upper surface of the silicon substrate 1, and ion is injected to the inside to decrease resistance of the silicon layer. On top of this surface, a silicon layer is patterned in a predetermined shape according to a photolithographic method, thereby disposing gate electrodes 5a and 5b substantially in parallel. The gate electrodes 5a and 5b form a part of a word line WL.

The two gate electrodes 5a and 5b are disposed substantially in parallel on one p-well 3a in the memory cell area A. The gate electrodes 5a and 5b form a part of the word line WL.

In the memory cell area A, an n-type impurity is ion injected into the p-well 3a at both sides of the gate electrodes 5a and 5b, thereby forming an n-type impurity diffusion area 6a that becomes a source and a drain of an n-channel MOS transistor. At the same time, an n-type impurity diffusion area is also formed in a p-well (not shown) in the peripheral circuit area B. A p-type impurity is ion injected into the n-well 3b at both sides of a gate electrode 5c, thereby forming a p-type impurity diffusion area 6b that becomes a source and a drain of a p-channel MOS transistor.

An insulation layer is formed on the whole surface of the silicon substrate 1. Then, the insulation layer is etched back to leave a sidewall insulation layer 7 at only both sides of the gate electrodes 5a, 5b, and 5c. For the insulation layer, silicon oxide ($SiO_2$) is formed, for example, by the CVD method.

An n-type impurity ion is injected again into the p-well 3a, using the gate electrodes 5a, 5b, and 5c, and the sidewall insulation layer 7 as a mask, thereby forming the n-type impurity diffusion area 6a in an LDD structure. Further, a p-type impurity ion is injected again into the n-well 3b, thereby forming the p-type impurity diffusion area 6b in an LDD structure. The n-type impurity and the p-type impurity are separated using a resist pattern.

As explained above, in the memory cell area A, an n-type MOSFET is structured by the p-well 3a, the gate electrodes 5a and 5b, and the n-type impurity diffusion area 6a at both sides of these gate electrodes and the like. In the peripheral circuit area B, a p-type MOSFET is structured by the n-well 3b, the gate electrode 5c, and the p-type impurity diffusion area 6b at both sides of this gate electrode and the like.

Next, high-melting point metal layer, such as a Ti or Co layer, is formed on the whole surface, and this high-melting point metal layer is heated to form high-melting point metal silicide layers 8a and 8b on the surfaces of the n-type impurity diffusion area 6a and the p-type impurity diffusion area 6b, respectively. Thereafter, an unreacted high-melting point metal layer is removed by wet etching.

Next, based on the plasma CVD method, a silicon nitride (SiON) layer is formed in the thickness of about 200 nm as a cover layer 9 on the whole surface of the silicon substrate 1. Further, based on the plasma CVD method using TEOS gas, silicon oxide ($SiO_2$) is grown in the thickness of about 1.0 μm on the cover layer 9 as a first interlayer insulation layer 10.

The first interlayer insulation layer 10 is grinded to flatten the surface according to a chemical mechanical polishing (CMP) method.

Figure 7:
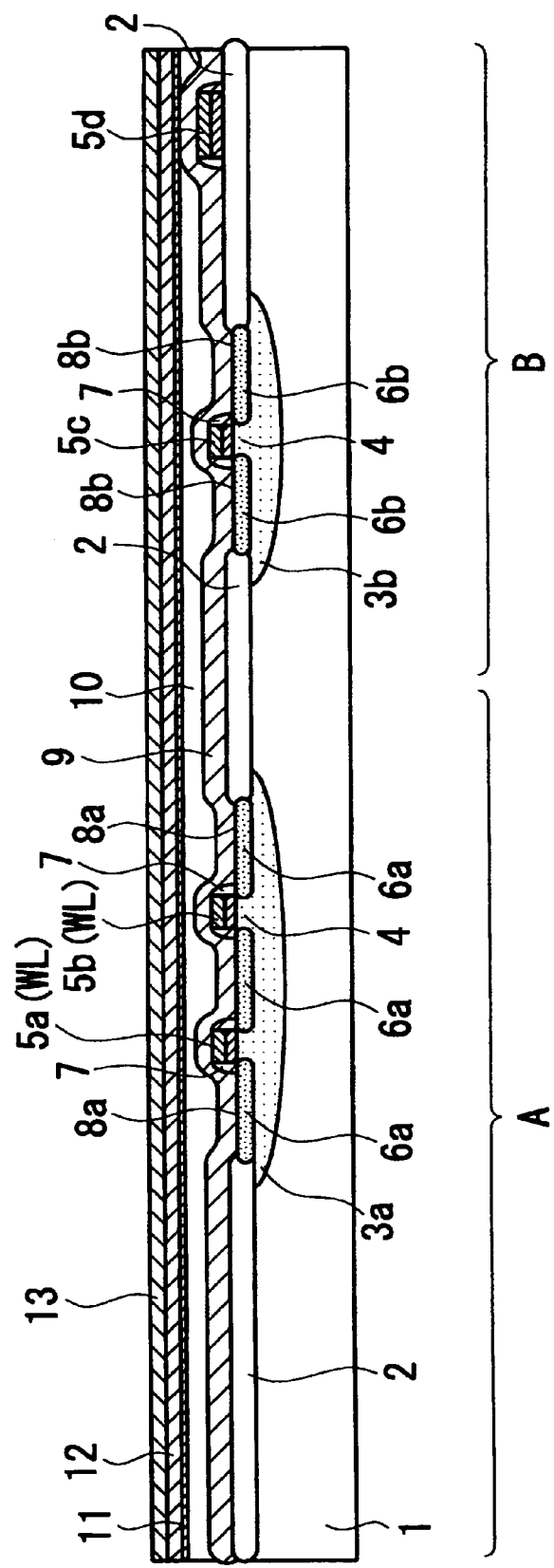
FIG. 7 is a diagram for explaining a process up to formation of a ground layer $Al_2O_3$ from a flattening of an interlayer insulation layer.

FIG. 7 is a diagram for explaining a process up to formation of an $Al_2O_3$ ground layer from the flattening of the interlayer insulation layer.

After flattening the interlayer insulation layer 10, the $Al_2O_3$ ground layer 11 is formed on the first interlayer insulation layer 10 by the DC sputtering method. This $Al_2O_3$ ground layer 11 improves the orientation intensity of the lower electrode 12 as a first conductive layer to be formed on this ground layer, and blocks diffusion of Pb in the PLZT layer 13 to be formed on the lower electrode 12.

Figure 8:
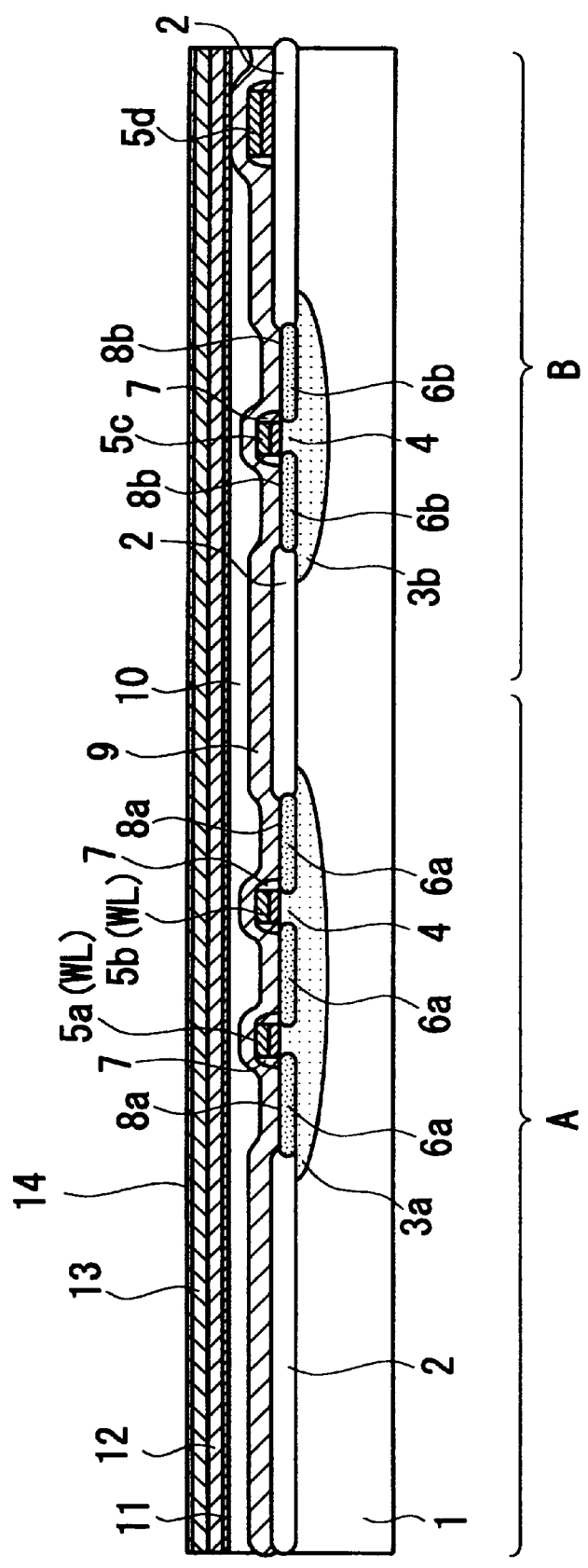
FIG. 8 is a diagram for explaining a process up to formation of a PLZT layer from the $Al_2O_3$ ground layer.

FIG. 8 is a diagram for explaining a process up to formation of the PLZT layer 13 from the $Al_2O_3$ ground layer.

After forming the $Al_2O_3$ ground layer 11, a Pt layer as the lower electrode 12 as the first conductive layer is formed in the thickness of 175 nm by the sputtering method. The sputtering is carried out at an Ar gas pressure 0.6 Pa, with DC power 1 kW, and at a temperature 100° C. For the lower electrode 12, an Ir or $IrO_x$ layer, or a layer of these mixed crystals can be formed.

According to the sputtering method, the PLZT layer 13 is formed in the thickness of 100 to 300 nm, for example, 240 nm, on the lower electrode 12. This PLZT layer 13 is used as the ferroelectric layer 13. Ca, Sr, Ir, and Ru can be added to the PLZT layer 13 of the ferroelectric layer.

The silicon substrate 1 is placed in an oxygen atmosphere, and a ferroelectric is structured at 585° C. for 20 seconds, at a programming rate 125° C./sec, and at $O_2$:2.5%/Ar:97.5%. The PLZT layer 13 is RTA (rapid thermal annealing) treated to crystallize the PLZT layer 13.

A ferroelectric material layer can be formed by the spin-on method, the sol-gel method, the MOD (metal organic deposition) method, and the MOCVD method, in addition to the sputtering method.

Figure 9:
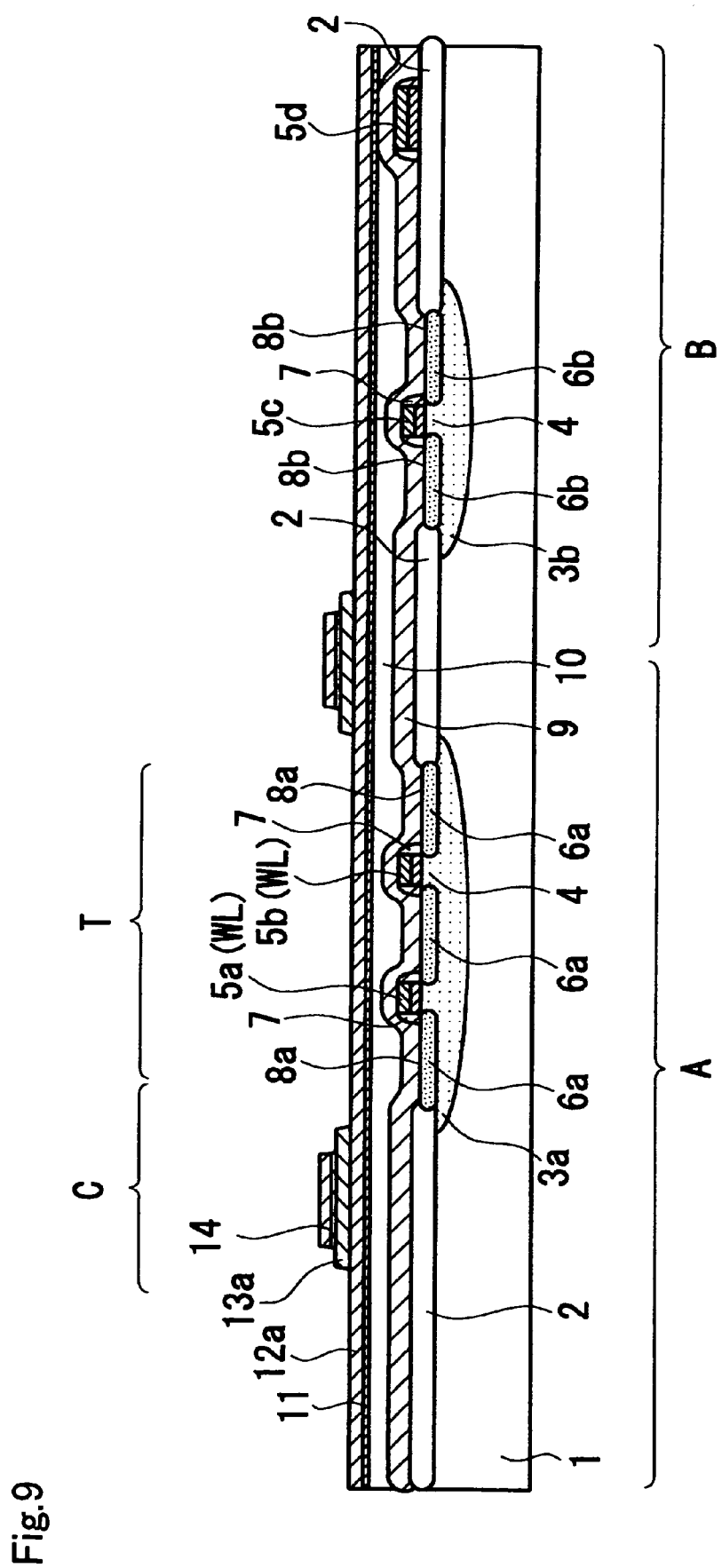
FIG. 9 is a diagram for explaining a process up to formation of an upper electrode on the PLZT layer.

FIG. 9 is a diagram for explaining a process up to formation of the upper electrode on the PLZT layer.

After the PLZT layer 13 is formed, an IrOx layer is formed as the upper electrode 14 in the thickness of 20 to 75 nm, for example 50 nm, on the PLZT layer 13, by the sputtering method. Thereafter, by the RTA method, heat treatment is carried out at 725° C. for 1 minute in the oxidizing atmosphere of $O_2$/Ar=1/99%, thereby crystallizing the PLZT layer 13 and annealing the upper electrode 14. For the upper electrode 14, a layer including Ir, $IrO_x$, Ru, $RuO_x$, $SrRuO_3$, and Pt can be formed on the PLZT layer 13, by the sputtering method.

After the PLZT layer 13 is formed, an IrOx layer is formed as the upper electrode 14 in the thickness of 20 to 75 nm, for example 50 nm, on the PLZT layer 13, by the sputtering method, without carrying out a heat treatment. Thereafter, by the RTA method, heat treatment can be carried out at 585° C. for 90 seconds in the oxidizing atmosphere of $O_2$/Ar=2.5/97.5%, thereby crystallizing the PLZT layer 13, and annealing the lower electrode 12 and the upper electrode 14.

Figure 10:
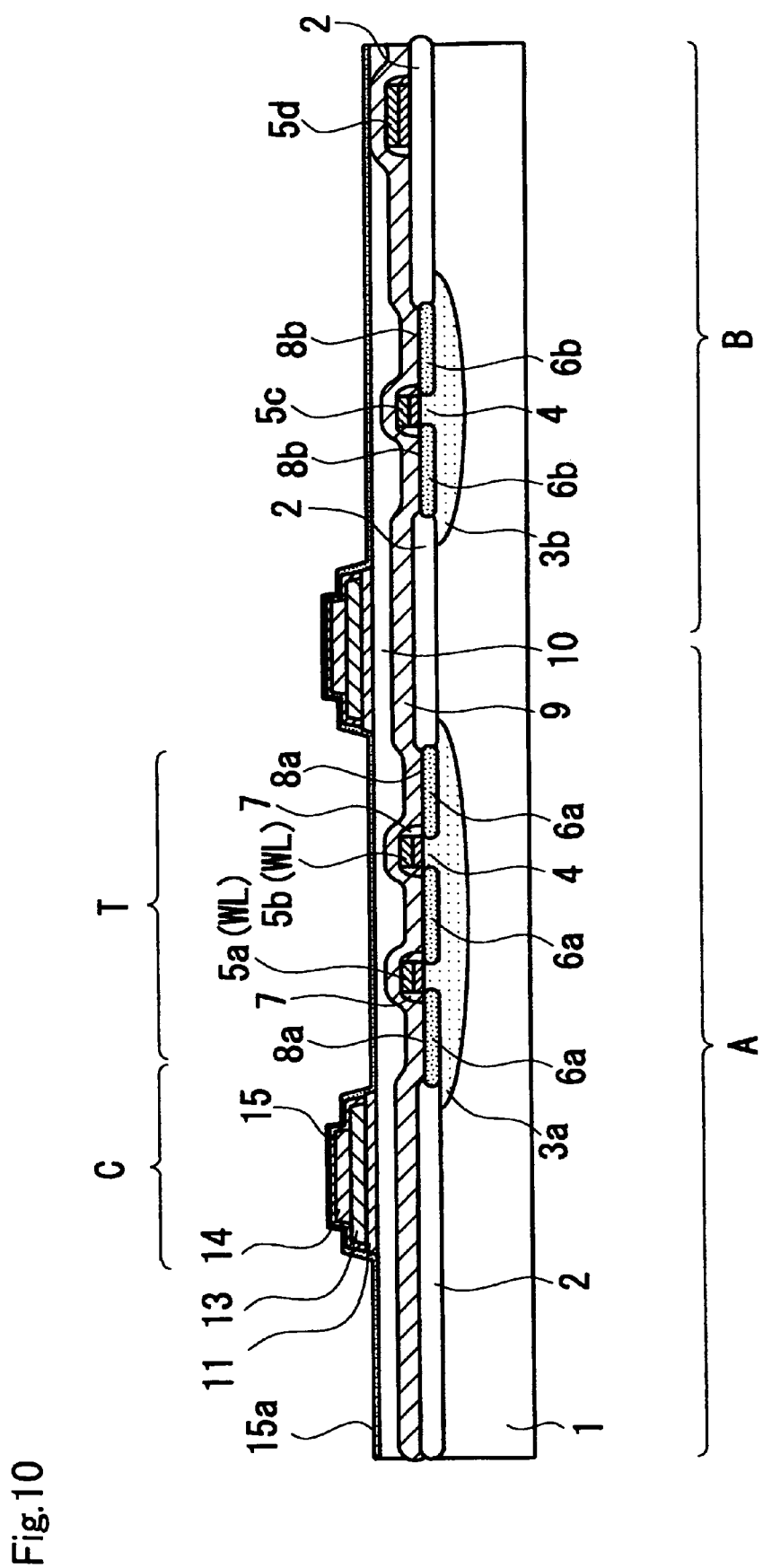
FIG. 10 is a diagram for explaining a process up to etching of the PLZT layer after forming the upper electrode.

FIG. 10 is a diagram for explaining a process up to etching of the PLZT layer after forming the upper electrode.

After a resist pattern (not shown) is formed on the upper electrode 14, the upper electrode 14 is etched using this resist pattern as a mask. The etched result is used as the upper electrode 14 of the capacitor. After the resist pattern is removed, the ferroelectric layer 13 is annealed at 650° C. for 60 minutes in an oxygen atmosphere. This annealing is carried out to recover from a damage and to degass water contents absorbed in the ferroelectric layer 13 at the time of sputtering and etching the upper electrode 14. The crystal grain of the ferroelectric layer 13 can be increased to improve the dielectric characteristics and to compensate for the loss of oxygen in the ferroelectric layer 13.

Figure 11:
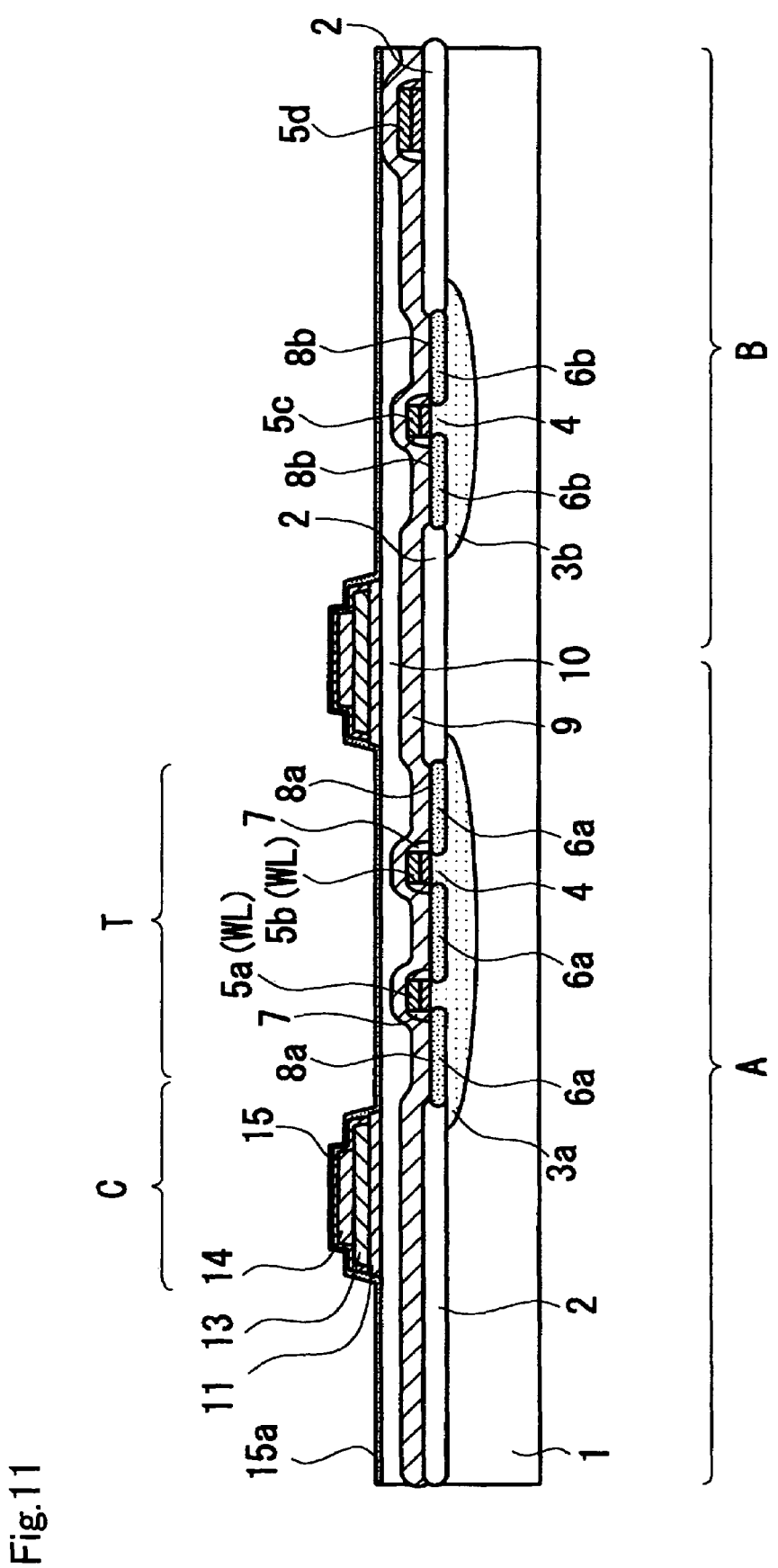
FIG. 11 is a diagram for explaining a process up to formation of an encap layer after etching the PLZT layer.

FIG. 11 is a diagram for explaining a process up to formation of an encap layer after etching the PLZT layer.

The $Al_2O_3$ ground layer 11 is formed as an encap layer 15 in the thickness of 50 nm at a normal temperature on the upper electrode 14, the ferroelectric layer 13, and the lower electrode 12, by the sputtering method. The encap layer 15 is formed to protect the reducible ferroelectric layer 13 from hydrogen, and to block hydrogen from entering into the ferroelectric layer 13. For the encap layer 15, a PZT layer, a PLZT layer, or a titanium oxide layer can be formed. For the encap layer 15, an $Al_2O_3$ layer, a PZT layer, or a titanium oxide layer can be formed by the MO-CVD method, or can be laminated by the sputtering method and the MO-CVD method. When the lamination is carried out, it is preferable to form $Al_2O_3$ by sputtering first, in consideration of degradation of the capacitor. Thereafter, the encap layer 15 is heat treated at 55° C. for 60 minutes in an oxygen atmosphere.

Next, a resist is coated on the encap layer 15. The coating is exposed and developed, and is left on the upper electrode 14 and the ferroelectric layer 13 at the periphery. The encap layer 15, the lower electrode 12, and the $Al_2O_3$ ground layer 11 are etched using the resist as a mask. The lower electrode 12 and the $Al_2O_3$ ground layer 11 that remain after the etching are used for the lower electrode 12 of the capacitor. The encap layer 15, the lower electrode 12, and the $Al_2O_3$ ground layer 11 are etched by dry etching using chlorine.

After the resist pattern is removed, heat treatment is carried out by annealing at 350° C. for 30 minutes in an oxygen atmosphere. With this arrangement, removal of a layer deposited in the post treatment can be prevented. Thereafter, an $Al_2O_3$ layer 15a is formed as the encap layer 15 in the thickness of 20 nm by the sputtering method.

The ferroelectric layer 13 is heated at 650° C. for 60 minutes in an oxygen atmosphere to increase the crystal grain size, thereby improving dielectric characteristics and compensating for the loss of oxygen in the ferroelectric layer 13. As a result, as shown in FIG. 11, a capacitor C including the lower electrode 12, the ferroelectric layer 13, and the upper electrode 14 is formed on the first interlayer insulation layer 10. A reference symbol T denotes a transistor, which is not described in detail.

Figure 12:
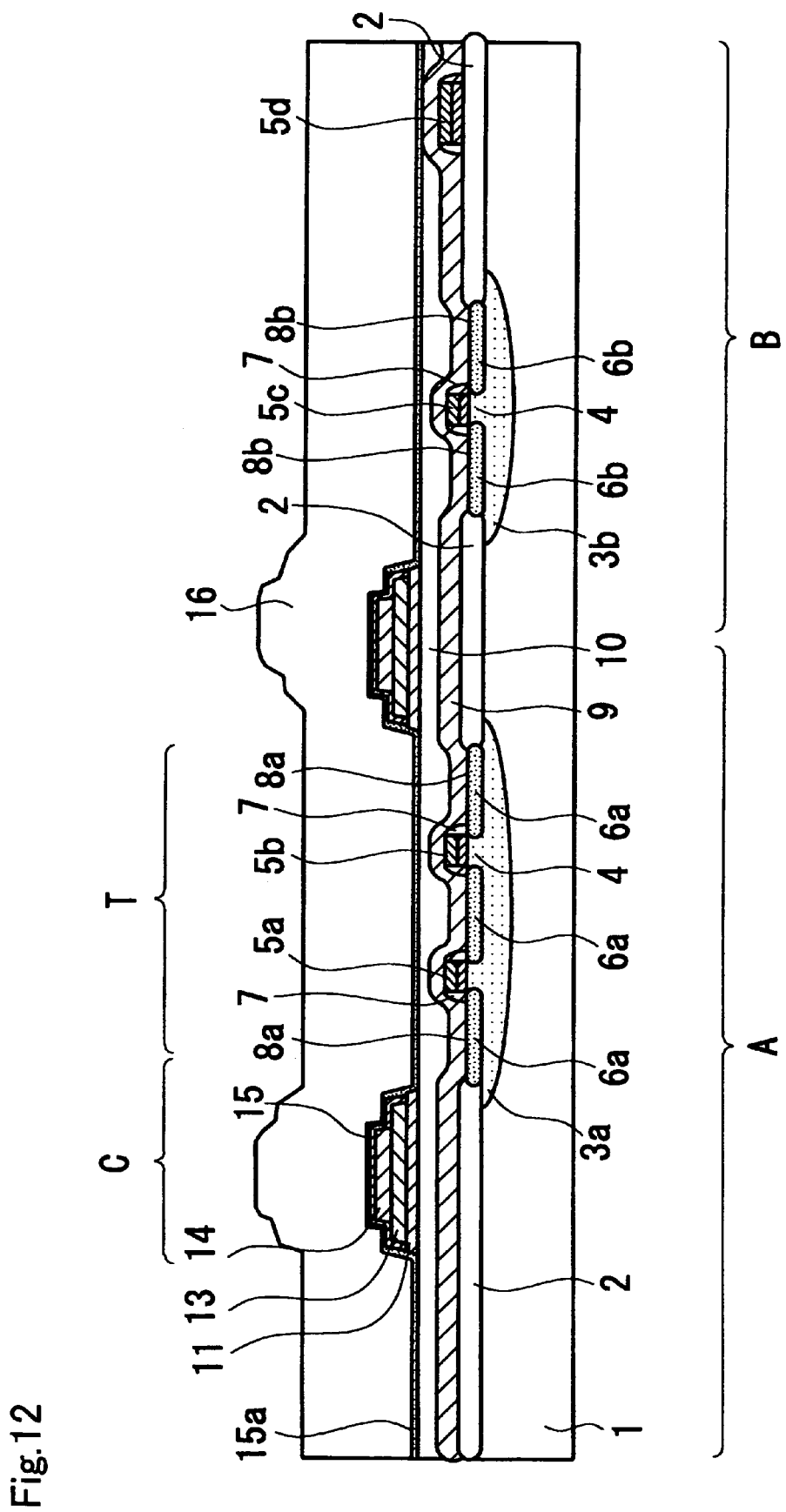
FIG. 12 is a diagram for explaining a process up to formation of a second interlayer insulation layer on a capacitor, after forming the encap layer and the capacitor.

FIG. 12 is a diagram for explaining a process up to formation of a second interlayer insulation layer on the capacitor, after forming the encap layer and the capacitor.

As shown in FIG. 12, a $SiO_2$ layer is formed in the layer thickness of 1500 nm as a second interlayer insulation layer 16 on a capacitor Q and the first interlayer insulation layer 10, by the CVD method. The second interlayer insulation layer 16 can be formed using silane ($SiH_4$), polysilane compound ($Si_2F_6$, $Si_3F_8$, $Si_2F_3Cl$, etc.), and $SiF_4$, or using TEOS, as gas. The second interlayer insulation layer 16 can be formed according to plasma excitation (the ECR (electron cyclotron resonance) method, the ICP (inductively coupled plasma) method, the HDP-(high density plasma) method, and the EMS (electron magneto-sonic) method), thermal excitation, or an excitation method using a laser beam.

Figure 13:
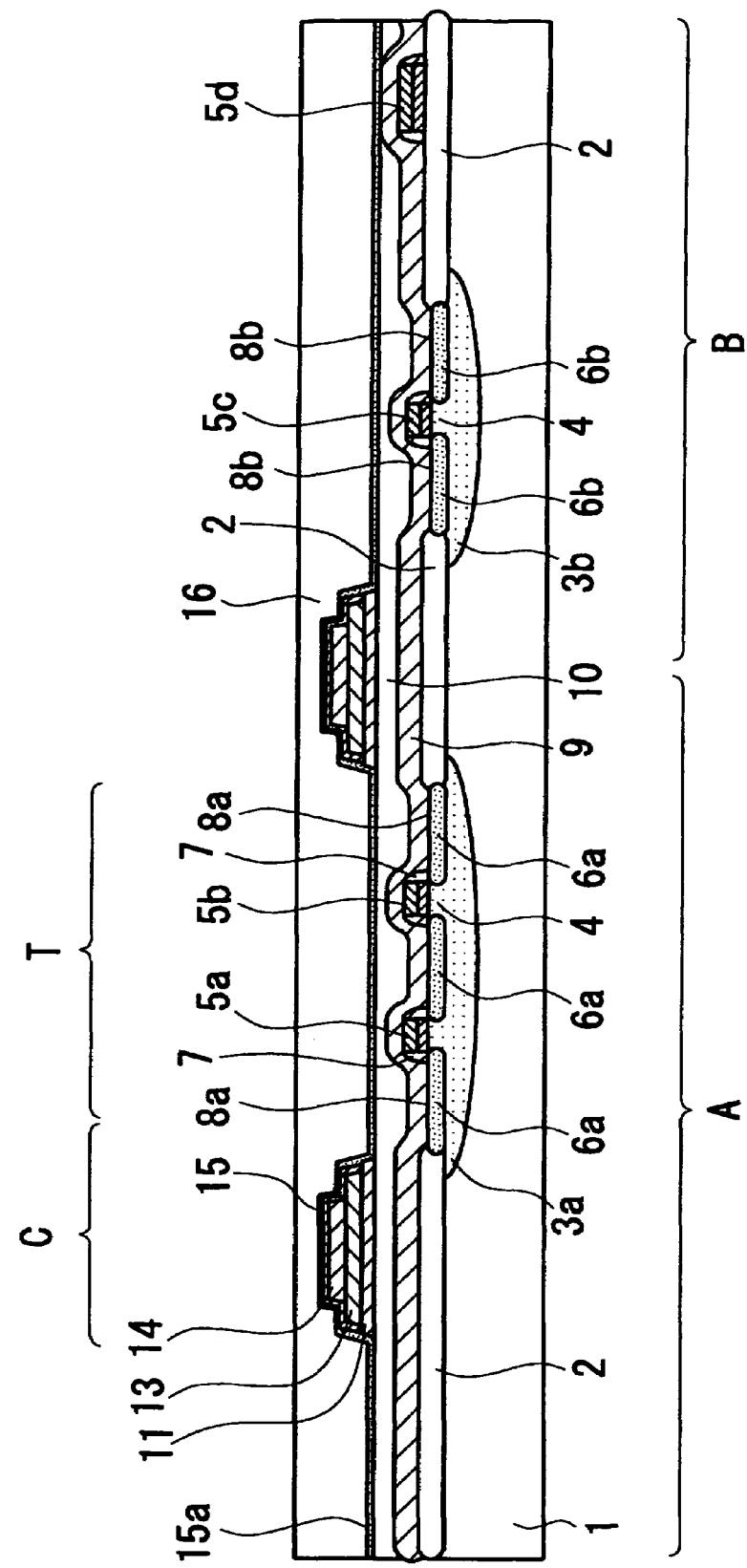
FIG. 13 is a diagram for explaining a process up to flattening of the second interlayer insulation layer.

FIG. 13 is a diagram for explaining a process up to flattening of the second interlayer insulation layer.

Thereafter, as shown in FIG. 13, the second interlayer insulation layer 16 is flattened by the CMP method. The surface of the second interlayer insulation layer 16 is flattened up to the thickness of 400 nm from the upper surface of the upper electrode 14. The water content in the slurry used for the flattening according to the CMP method, and the water content in the cleaning solution used for the subsequent cleaning are adhered to the surface of the second interlayer insulation layer 16 or absorbed inside the second interlayer insulation layer 16. The second interlayer insulation layer 16 is heated at 390° C. in a vacuum chamber (not shown), thereby discharging the water content on the surface of or inside the second interlayer insulation layer 16 to the outside.

After this dewatering, the second interlayer insulation layer 16 is heated and aerated to the $N_2O$ plasma to remove water. As a result, degradation of the capacitor due to the heating and water at the subsequent processing can be prevented. The dewatering and the plasma treatment can be carried out in a same chamber (not shown). A supporting electrode on which the silicon substrate 1 is mounted and a counter electrode that faces the supporting electrode are disposed in this chamber. A high-frequency power supply can be connected to the counter electrode. A high-frequency power is applied to the counter electrode in a state that $N_2O$ gas is introduced in the chamber, and $N_2O$ plasma is generated between the electrodes to carry out a $N_2O$ plasma treatment of the insulation layer. According to this $N_2O$ plasma treatment, nitrogen is included in at least the surface of the insulation layer. This method is employed in the following dewatering and plasma treatment. In the plasma treatment following the dewatering, $N_2O$ plasma is preferably used. Alternatively, NO plasma and $N_2$ plasma can be used. The substrate temperature for the dewatering and the substrate temperature for the plasma treatment are substantially equal.

Figure 14:
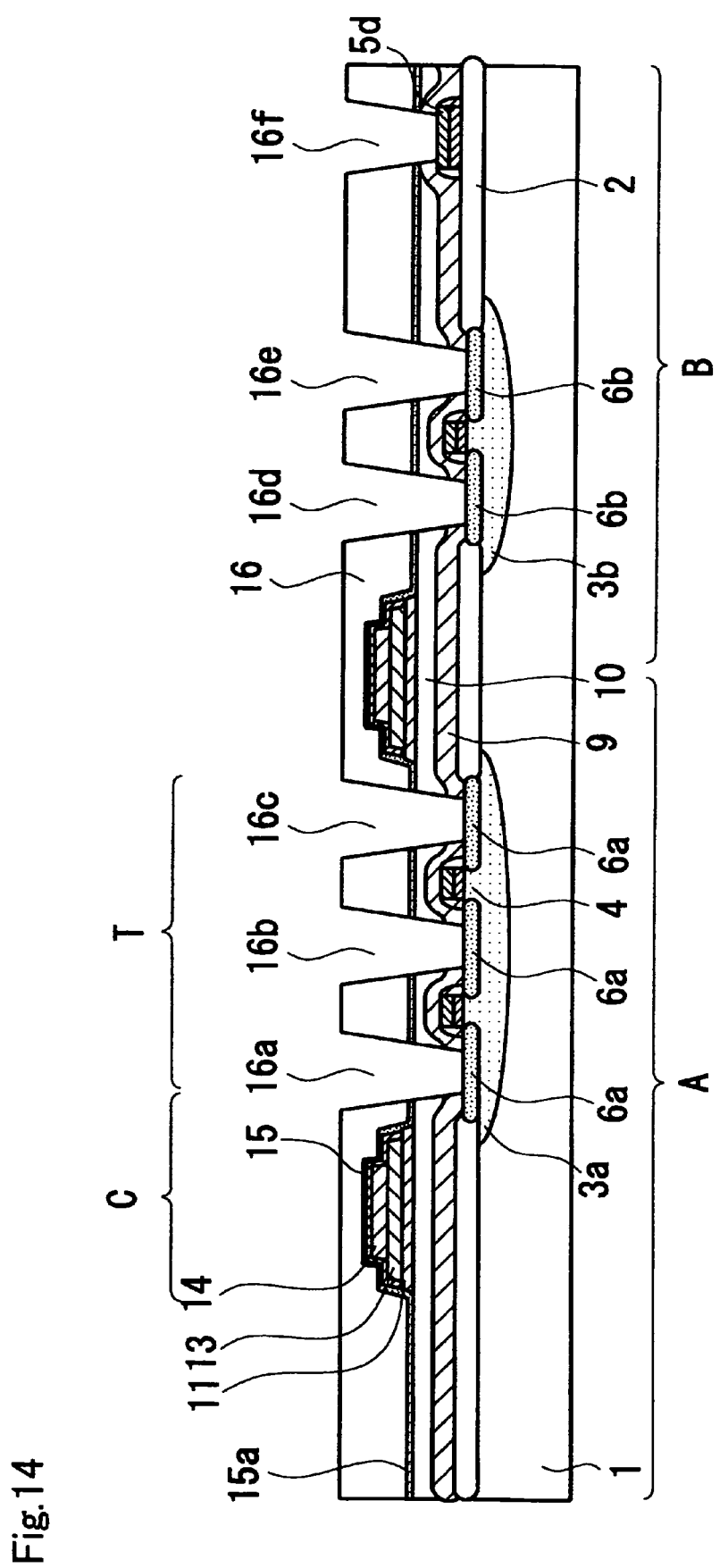
FIG. 14 is a diagram showing a process up to formation of a contact hole on a Si bulk diffusion layer after flattening the second interlayer insulation layer.

FIG. 14 is a diagram showing a process up to formation of a contact hole on a Si bulk diffusion layer after flattening the second interlayer insulation layer.

As shown in FIG. 14, a resist is coated on the second interlayer insulation layer 16, and this is exposed and developed. The first interlayer insulation layer 10, the encap layer 15 of $Al_2O_3$, the second interlayer insulation layer 16, and the cover layer 9 are dry etched, thereby simultaneously forming holes 16a, 16b, and 16c on the impurity diffusion layer 6a in the memory cell area A, holes 16d and 16e on the impurity diffusion layer 6b in the peripheral circuit area B, and a hole 16f on the gate electrode 5d on the LOCOS layer 2.

The second interlayer insulation layer 16, the encap layer 15a, the first interlayer insulation layer 10, and the cover layer 9 are etched using a mixed gas of a CF gas such as $CHF_3$ added with $CF_4$ and Ar.

Figure 15:
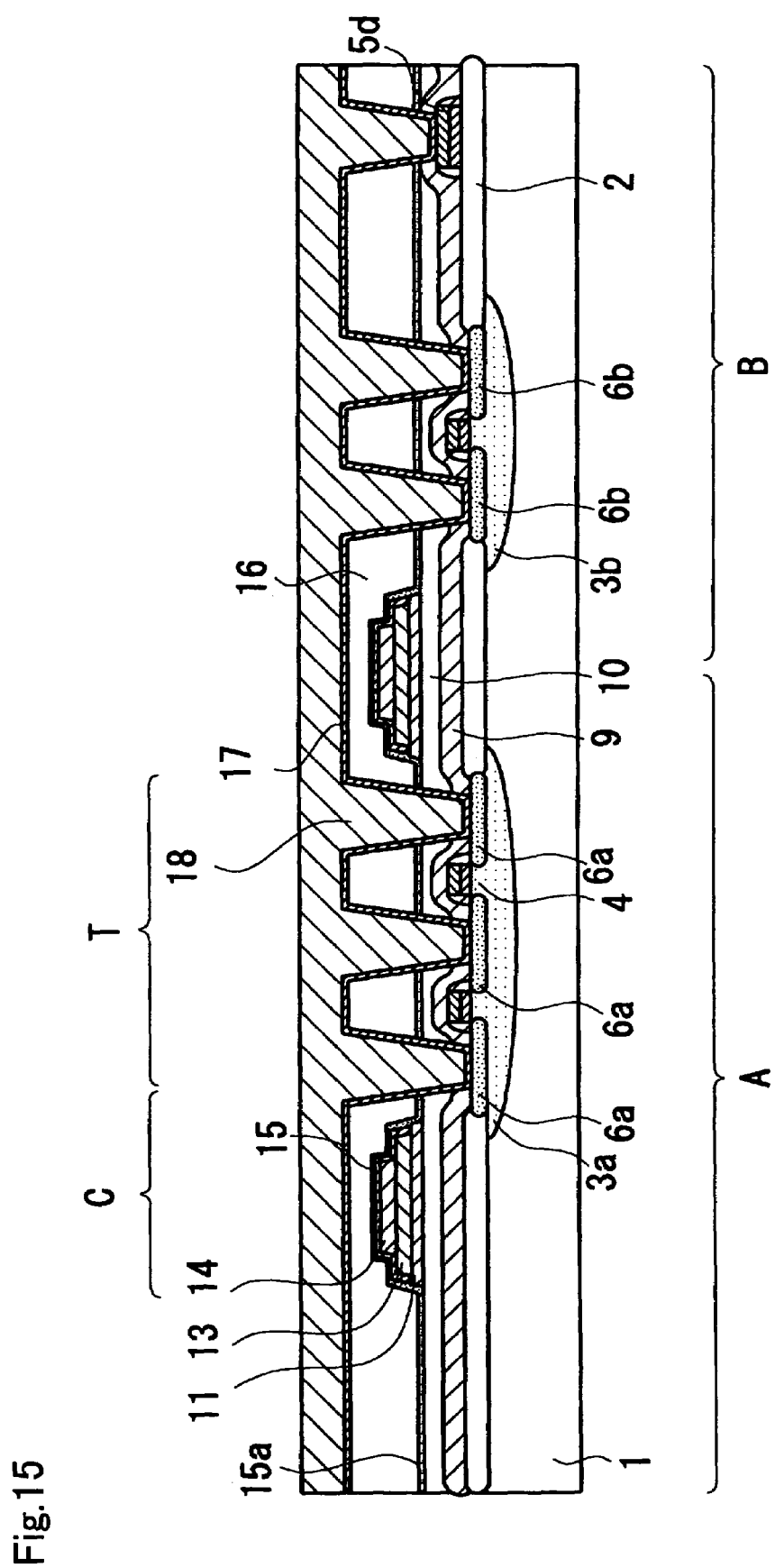
FIG. 15 is a diagram showing a process up to formation of a tungsten layer on the second interlayer insulation layer.

FIG. 15 is a diagram showing a process up to formation of a tungsten layer on the second interlayer insulation layer.

As shown in FIG. 15, after an Rf pre-processing etching is carried out to the upper surface of the second interlayer insulation layer 15 and to the internal surface of the contact holes 15a to 15f, a titanium (Ti) layer is formed in the thickness of 20 nm and a titanium nitride (TiN) layer is formed in the thickness of 50 nm continuously on the etched surfaces, by the sputtering method. This layer is called a close contact layer 17. A tungsten layer 18 is formed on the close contact layer 17 by the CVD method using a mixed gas of tungsten fluoride gas ($WF_6$), Ar, and $H_2$.

In the early stage of development of the tungsten layer 18, silane ($SiH_4$) gas is also used. The tungsten layer 18 has a thickness of completely embedding the contact holes 15a to 15f, for example, about 500 nm on the close contact layer 17.

Figure 16:
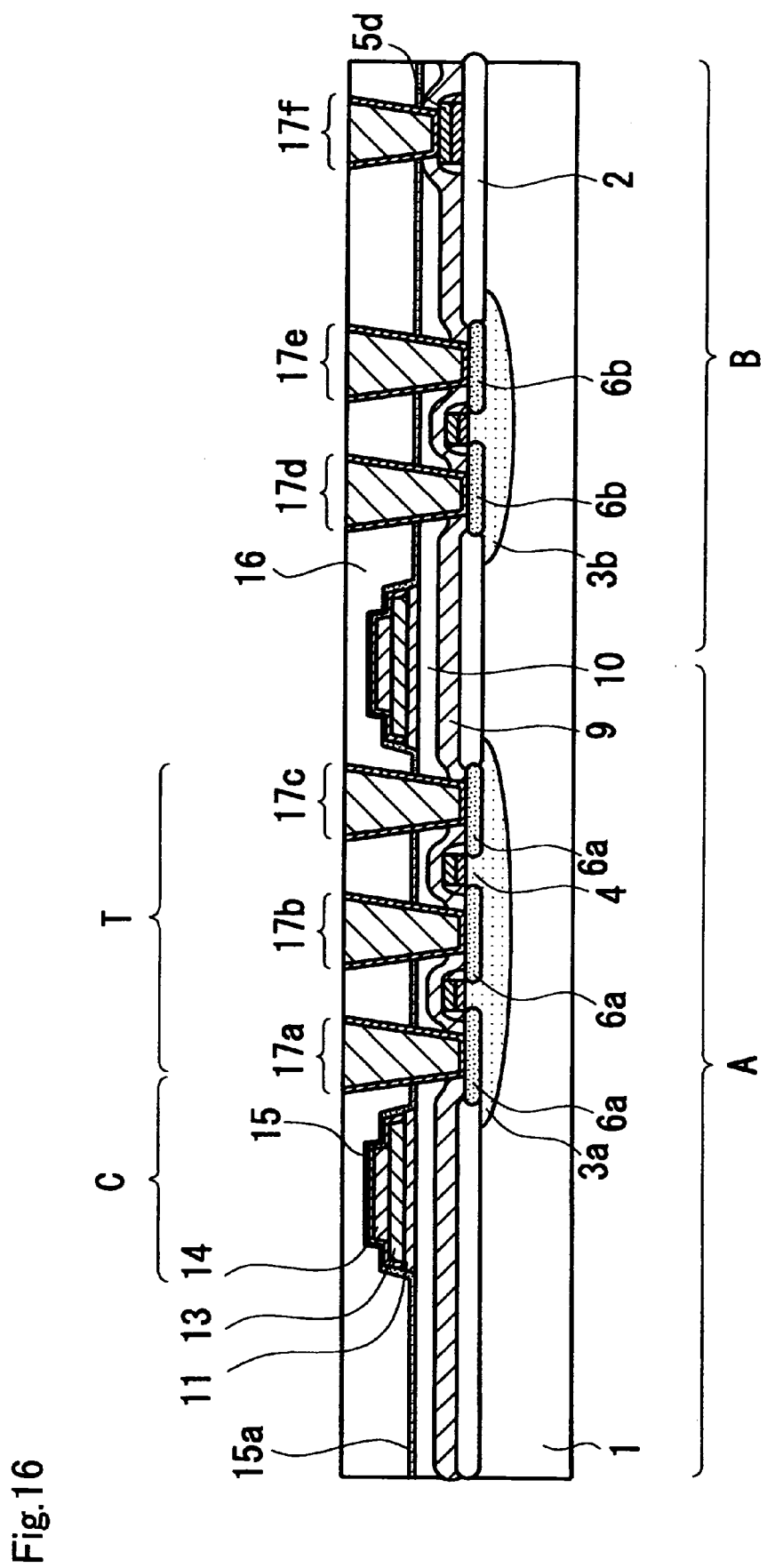
FIG. 16 is a diagram showing a process up to flattening of the tungsten layer by grinding the layer.

FIG. 16 is a diagram showing a process up to flattening of the tungsten layer by grinding this layer.

As shown in FIG. 16, the tungsten layer 18 and the close contact layer 17 on the second interlayer insulation layer 16 are removed by the CMP method, and are left within only the contact holes 16a to 16f. As a result, the tungsten layer 18 and the close contact layer 17 within the contact holes 16a to 16f are used for plugs 17a to 17f.

The second interlayer insulation layer 16 is heated again at 390° C. in the vacuum chamber to discharge water to the outside, in order to remove the water content adhered to the surface of or soaked into the second interlayer insulation layer 16 in the process of cleaning after forming the contact holes 16a to 16f and cleaning after the grinding by the CMP method. After this dewatering, the second interlayer insulation layer 16 is heated and aerated to the $N_2O$ plasma, and is annealed for 2 minutes, for example.

Figure 17:
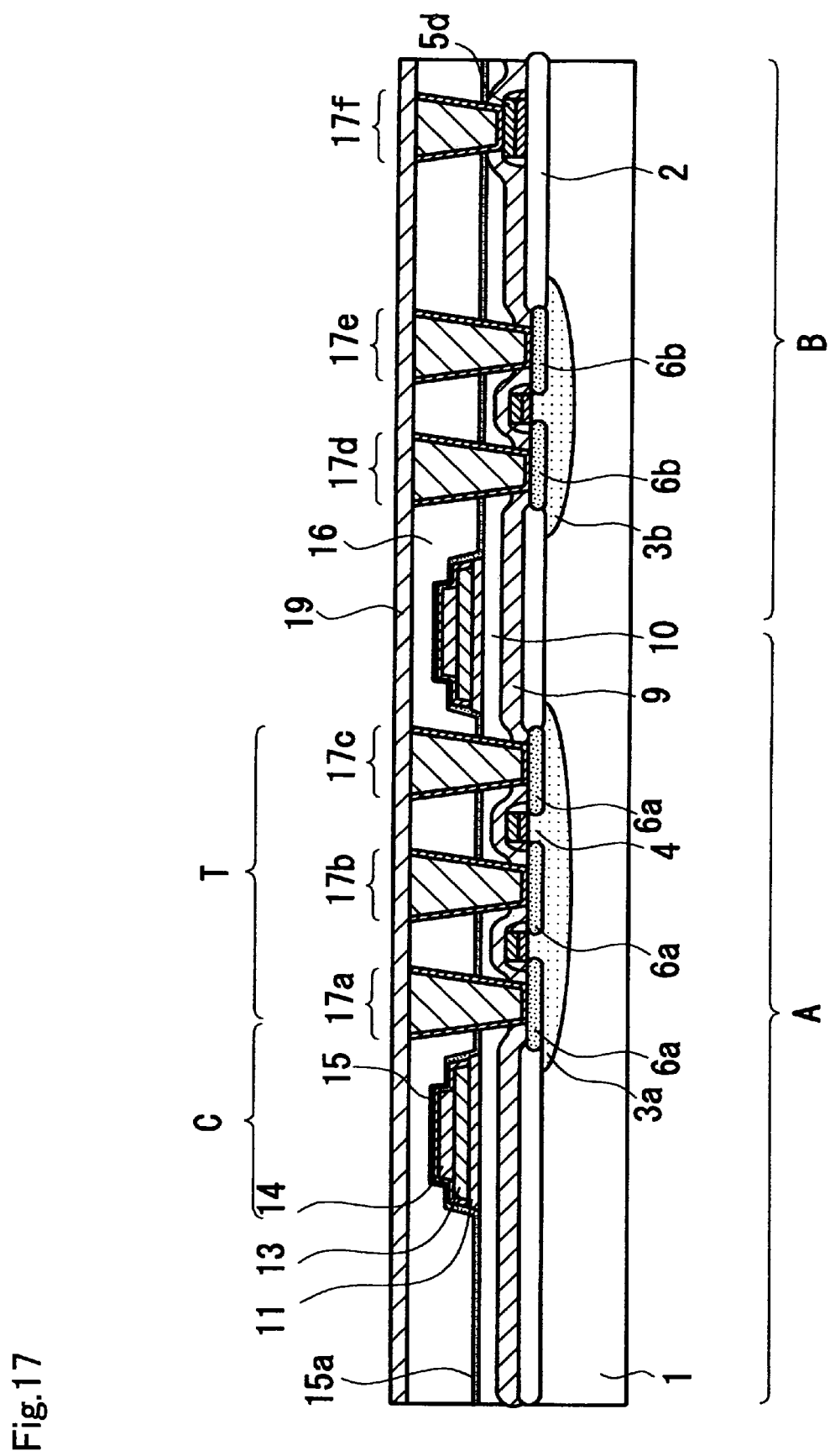
FIG. 17 is a diagram showing a process up to formation of an oxidation prevention layer after grinding the tungsten layer according to a CMP method.

FIG. 17 is a diagram showing a process up to formation of an oxidation prevention layer after grinding the tungsten layer by the CMP method.

As shown in FIG. 17, a P—SiON layer 19 as a tungsten oxidation prevention layer is formed in the thickness of 100 nm, for example, on the second interlayer insulation layer 16 and on the plugs 17a to 17f.

Figure 18:
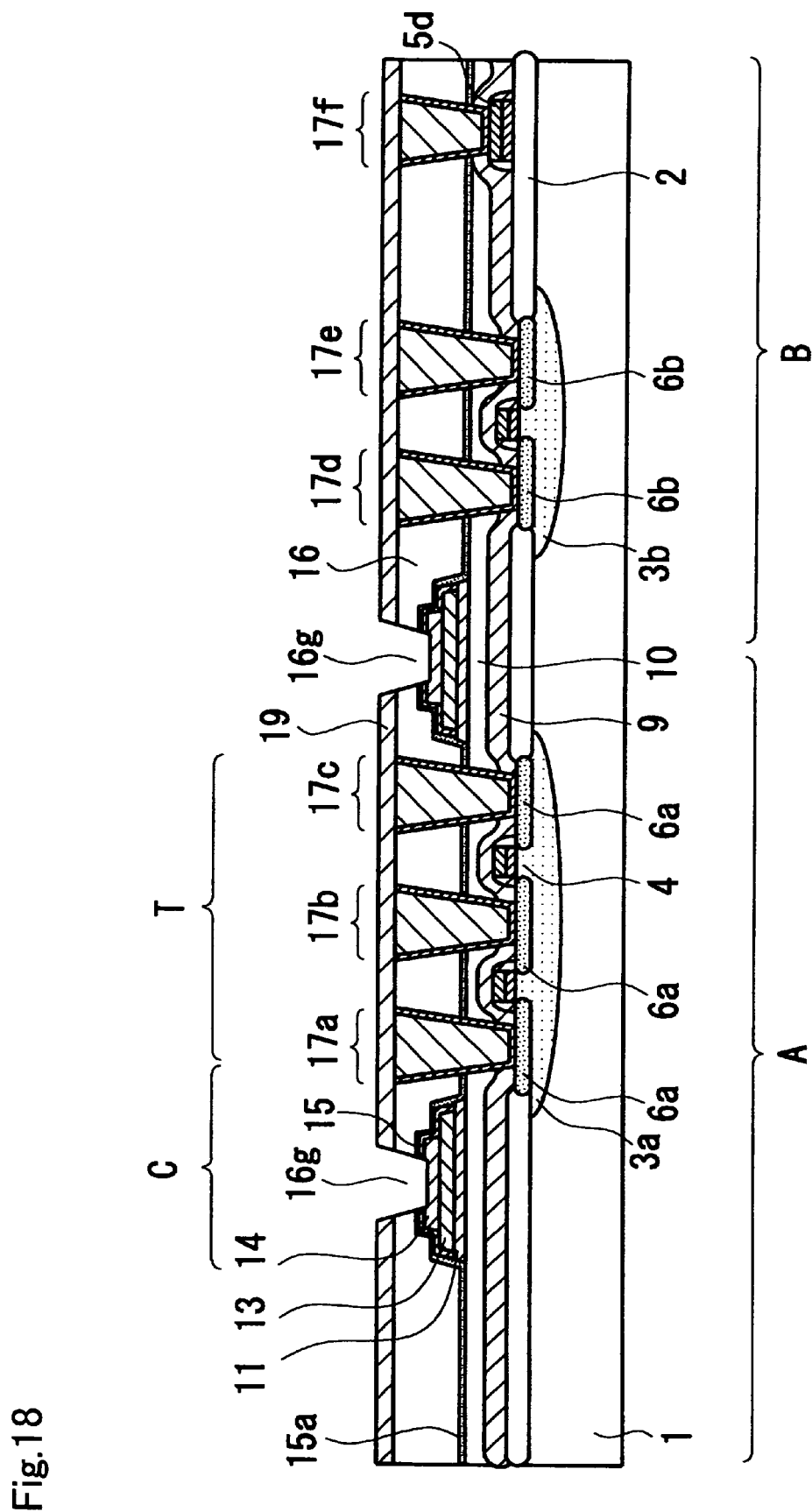
FIG. 18 is a diagram showing a process of heat treating by annealing in an oxygen atmosphere after forming the oxidation prevention layer.

FIG. 18 is a diagram showing a process of heat treating by annealing in an oxygen atmosphere after forming the oxidation prevention layer.

As shown in FIG. 18, holes are formed on the lower electrode 12 and the upper electrode 14. A hole 16g on the upper electrode 14 and a hole 16h (not shown) on the lower electrode 12 are formed by etching at the same time. This etching is carried out using a mixed gas of a CF gas such as $CHF_3$ added with $CF_4$ and Ar. The encap layer 15a is also etched using the same kind of gas. After the resist is removed, annealing is carried out at 550° C. for 60 minutes in an oxygen atmosphere, thereby improving the layer quality of the ferroelectric layer 13. In this case, oxidizable W plugs 17a to 17f are covered with the P—SiON layer 19, and therefore, are not oxidized.

Figure 19:
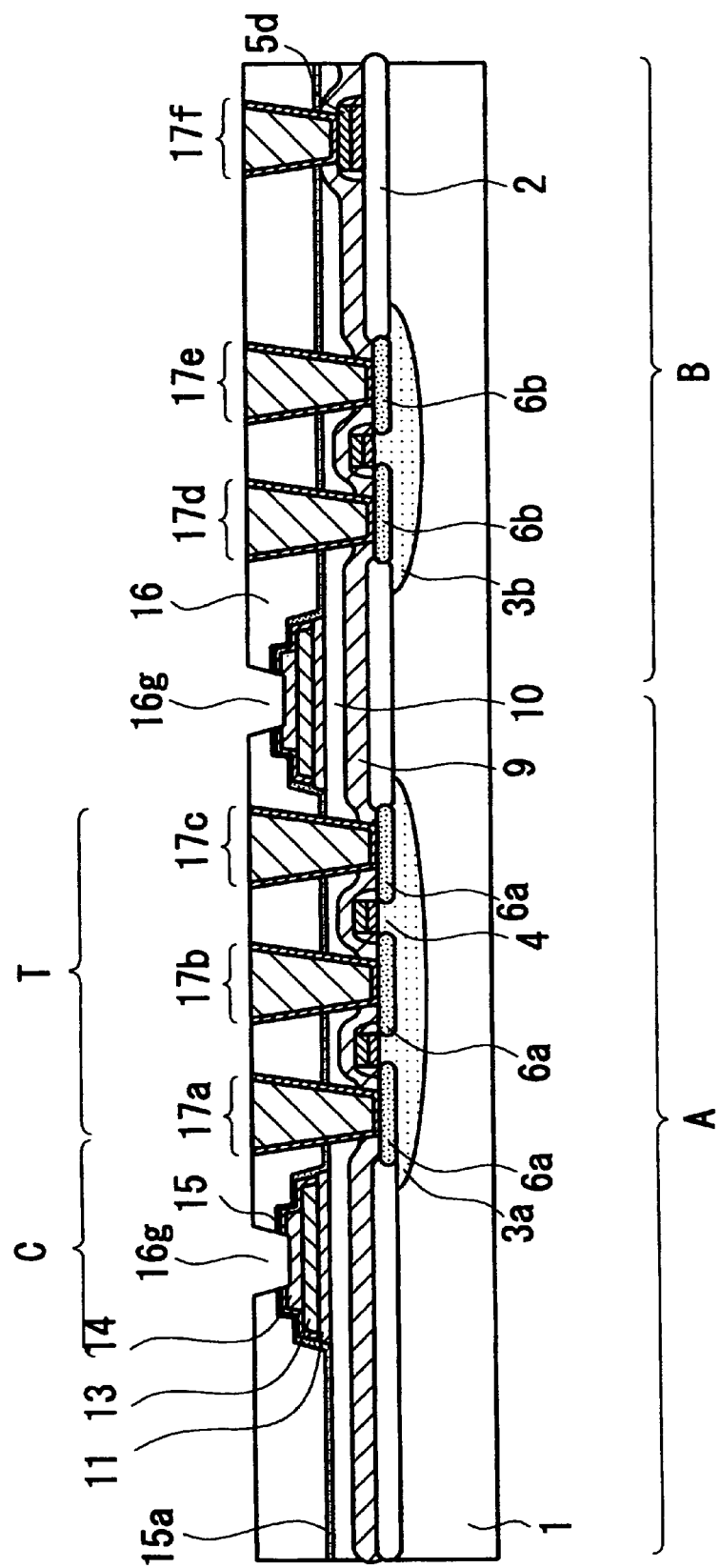
FIG. 19 is a diagram showing a process up to etching back of the oxidation prevention layer after heat treating by annealing in the oxygen atmosphere.

FIG. 19 is a diagram showing a process up to etching back of the oxidation prevention layer after heat treating by annealing in an oxygen atmosphere.

As shown in FIG. 19, the oxidation prevention layers P—SiON on the second interlayer insulation layer 16 and on the W plugs 17a to 17f are etched back to expose the W plugs 17a to 17f. In this case, the W plugs are scattered above the second interlayer insulation layer 16.

Figure 20:
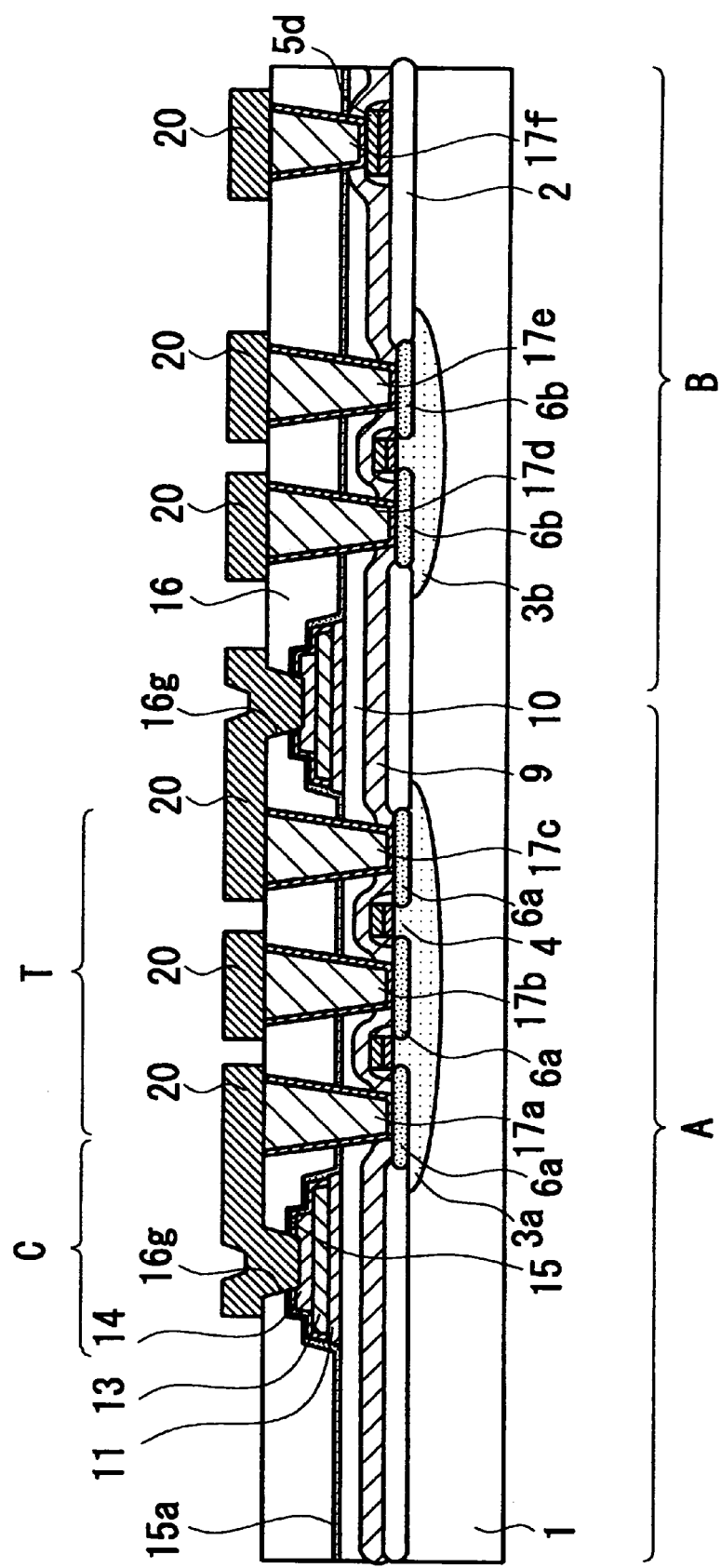
FIG. 20 is a diagram showing a process of forming an aluminum wiring by etching after etching back the oxidation prevention layer.

FIG. 20 is a diagram showing a process of forming an aluminum wiring by etching after etching back the oxidation prevention layer.

The second interlayer insulation layer 16, the plugs 17a to 17f, and the upper electrode 14 are etched on its surface by about 10 nm (in $SiO_2$ conversion) by the RF etching method, in a state that the second interlayer insulation layer 16, the plugs 17a to 17f, and the upper electrode 14 are exposed from the hole 16g, thereby exposing the cleaned surface.

Thereafter, as shown in FIG. 20, a conductive layer having a four-layer structure including aluminum (Al) is formed on the second interlayer insulation layer 16 and the plugs 17a to 17f, by the sputtering method. The conductive layer includes, in the order from the bottom, a titanium nitride (TiN) layer having a layer thickness of 150 nm, an aluminum layer including copper (0.5%) in a layer thickness of 550 nm, a titanium (Ti) layer in a layer thickness of 5 nm, and a titanium nitride (TiN) layer having a layer thickness of 150 nm. This conductive layer is patterned by the photolithography method, thereby forming a wiring 19. As a result, an Al three-layer wiring structure as shown in FIG. 1 is finally obtained.

Exemplary embodiments of the present invention are described above, however, the present invention is not limited by the embodiments, and various modifications and changes may be made within the scope of the spirit of the appended claims.

According to the ferroelectric element of the present invention, it is possible to obtain a ferroelectric layer that can be operated at a large switching charge Qsw even with a low voltage, and that has small fatigue characteristics that decreases Qsw due to a repeated use of the ferroelectric layer.

According to the method of manufacturing a ferroelectric element of the present invention, it is possible to easily manufacture a ferroelectric element that can be operated at a large switching charge Qsw even with a low voltage, and that has small fatigue characteristics due to a repeated use of the ferroelectric layer.

What is claimed is:

1. A ferroelectric element having a ferroelectric layer sandwiched by conductive electrodes on a substrate, wherein
    the ferroelectric element has a crystal structure in a tetragonal system, is constituted by lead lanthanum zirconate titanate (PLZT) having additional elements that make a (c/a) ratio of a lattice constant length of an axis c to a length of an axis a to within a range from 1.001 to 1.008, and includes a single layer ferroelectric layer.

2. The ferroelectric element according to claim 1, wherein the ferroelectric layer has 90% or more of a degree of orientation to a (111) surface in a thickness direction.

3. The ferroelectric element according to claim 1 or 2, wherein the ferroelectric layer is 100 nm or more.

4. The ferroelectric element according to claim 1 or 2, wherein the PLZT has a molar ratio (Zr/Ti) of zirconium (Zr) to titanium (Ti) within a range from 0.4 to 1.0.

5. The ferroelectric element according to claim 1 or 2, wherein the PLZT contains one or more additional element selected from metal elements of alkali earth metal or iron family.

6. The ferroelectric element according to claim 5, wherein the additional element is at least one element selected from Ca, Sr, Ir, and Ru.

7. The ferroelectric element according to claim 6, wherein the additional element is added by a value within a range from 0.01 to 0.1 to PLZT per 1.0 of PLZT at a molar ratio.

8. The ferroelectric element according to claim 1 or 2, comprising a lower electrode containing at least any one of Pt, Ir, and $IrO_x$.

9. The ferroelectric element according to claim 1 or 2, comprising an upper electrode containing at least any one of Ir, $IrO_x$, Ru, $RuO_x$, and $SrRuO_3$.

10. The ferroelectric element according to claim 9, comprising an upper electrode containing both or either one of $IrO_x$ and Ir.

11. A method of manufacturing a ferroelectric element having a ferroelectric layer sandwiched by conductive electrodes on a substrate, comprising: a step of forming a single layer lead lanthanum zirconate titanate (PLZT) precursor containing additional elements that make a (c/a) ratio of a lattice constant length of an axis c to a length of an axis a to within a range from 1.001 to 1.008 on a lower electrode of a conductive electrode; a step of first heat treating the precursor; and a step of second heat treating the precursor after forming an upper electrode thereon.

12. A method of manufacturing a ferroelectric element having a ferroelectric layer sandwiched by conductive electrodes on a substrate, comprising: a step of forming a single layer lead lanthanum zirconate titanate (PLZT) precursor containing additional elements that make a (c/a) ratio of a lattice constant length of an axis c to a length of an axis a to within a range from 1.001 to 1.008 on a lower electrode of a conductive electrode; and a step of heat treating the precursor after forming an upper electrode thereon at 200° C. or above.

13. The method of manufacturing a ferroelectric element according to claim 11 or 12, wherein the upper electrode contains at least any one of Ir, $IrO_x$, Ru, $RuO_x$, and $SrRuO_3$.

14. The method of manufacturing a ferroelectric element according to claim 13, wherein the upper electrode contains both or either one of Ir and $IrO_x$.

15. The method of manufacturing a ferroelectric element according to claim 11, wherein the first heat treatment is carried out at or below 650° C., and the second heat treatment is carried out at or above 650∪ C.

16. The method of manufacturing a ferroelectric element according to claim 12, wherein the heat treatment is carried out at or below 650° C.

17. The method of manufacturing a ferroelectric element according to claim 12, wherein the heat treatment is a multi-stage heat treatment, and a final heat treatment is carried out in a 100% oxygen atmosphere.

* * * * *